United States Patent
Park

(10) Patent No.: US 11,450,634 B2
(45) Date of Patent: Sep. 20, 2022

(54) PACKAGE SUBSTRATE AND SEMICONDUCTOR PACKAGE WITH ELEVATED BONDING PAD, AND COMPRISING THE SAME

(71) Applicant: Samsung Electronics Co., Ltd., Suwon-si (KR)

(72) Inventor: Jiwoo Park, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/167,518

(22) Filed: Feb. 4, 2021

(65) Prior Publication Data
US 2022/0013483 A1 Jan. 13, 2022

(30) Foreign Application Priority Data
Jul. 10, 2020 (KR) .......................... 10-2020-0085675

(51) Int. Cl.
*H01L 23/49* (2006.01)
*H01L 23/00* (2006.01)
*H01L 23/498* (2006.01)

(52) U.S. Cl.
CPC ........ *H01L 24/06* (2013.01); *H01L 23/49827* (2013.01); *H01L 23/49894* (2013.01); *H01L 24/49* (2013.01); *H01L 24/83* (2013.01); *H01L 2224/32225* (2013.01)

(58) Field of Classification Search
CPC ............... H01L 24/06; H01L 23/49827; H01L 23/49894; H01L 24/49; H01L 24/83; H01L 2224/32225; H01L 2224/32145

USPC ........................................................ 438/106
See application file for complete search history.

(56) References Cited

U.S. PATENT DOCUMENTS

| | | | |
|---|---|---|---|
| 6,839,476 B2 | 1/2005 | Kim et al. | |
| 8,823,185 B2 | 9/2014 | O et al. | |
| 9,230,942 B2 | 1/2016 | Kumar et al. | |
| 10,170,402 B2 | 1/2019 | Imazeki et al. | |
| 2004/0067606 A1 | 4/2004 | Fehr et al. | |
| 2008/0284017 A1* | 11/2008 | Lee | H01L 21/6835 257/738 |

(Continued)

FOREIGN PATENT DOCUMENTS

| | | |
|---|---|---|
| KR | 10-0451635 B1 | 10/2004 |
| KR | 10-2011-0055985 A | 5/2011 |
| KR | 10-1311707 B1 | 9/2013 |

*Primary Examiner* — Didarul A Mazumder
(74) *Attorney, Agent, or Firm* — Muir Patent Law, PLLC

(57) ABSTRACT

A package substrate includes a first insulating layer, a first redistribution wiring buried in the first insulating layer, a first bonding pad including a lower surface disposed on an upper surface of the first insulating layer, and a first bonding surface, and a second, elevated, bonding pad disposed on the upper surface of the first insulating layer. The second bonding pad includes a metal layer disposed on the upper surface of the first insulating layer, and a second bonding pad layer having a lower surface connected to the metal layer and a second bonding surface. The metal layer is disposed between the upper surface of the first insulating layer and the lower surface of the second bonding pad layer. The second bonding surface of the second bonding pad layer is higher than the first bonding surface of the first bonding pad.

20 Claims, 20 Drawing Sheets

(56) References Cited

U.S. PATENT DOCUMENTS

| | | | |
|---|---|---|---|
| 2012/0038041 A1* | 2/2012 | Tain | H01L 23/3732 |
| | | | 257/737 |
| 2012/0273960 A1* | 11/2012 | Park | H01L 23/49827 |
| | | | 257/774 |
| 2013/0161837 A1* | 6/2013 | Chen | H01L 23/49827 |
| | | | 257/784 |
| 2014/0264835 A1* | 9/2014 | Wang | H01L 23/5384 |
| | | | 257/737 |
| 2014/0312474 A1 | 10/2014 | Joshi et al. | |
| 2017/0125393 A1* | 5/2017 | Kwon | H01L 23/3128 |
| 2019/0067034 A1* | 2/2019 | Pachamuthu | H01L 23/481 |

\* cited by examiner

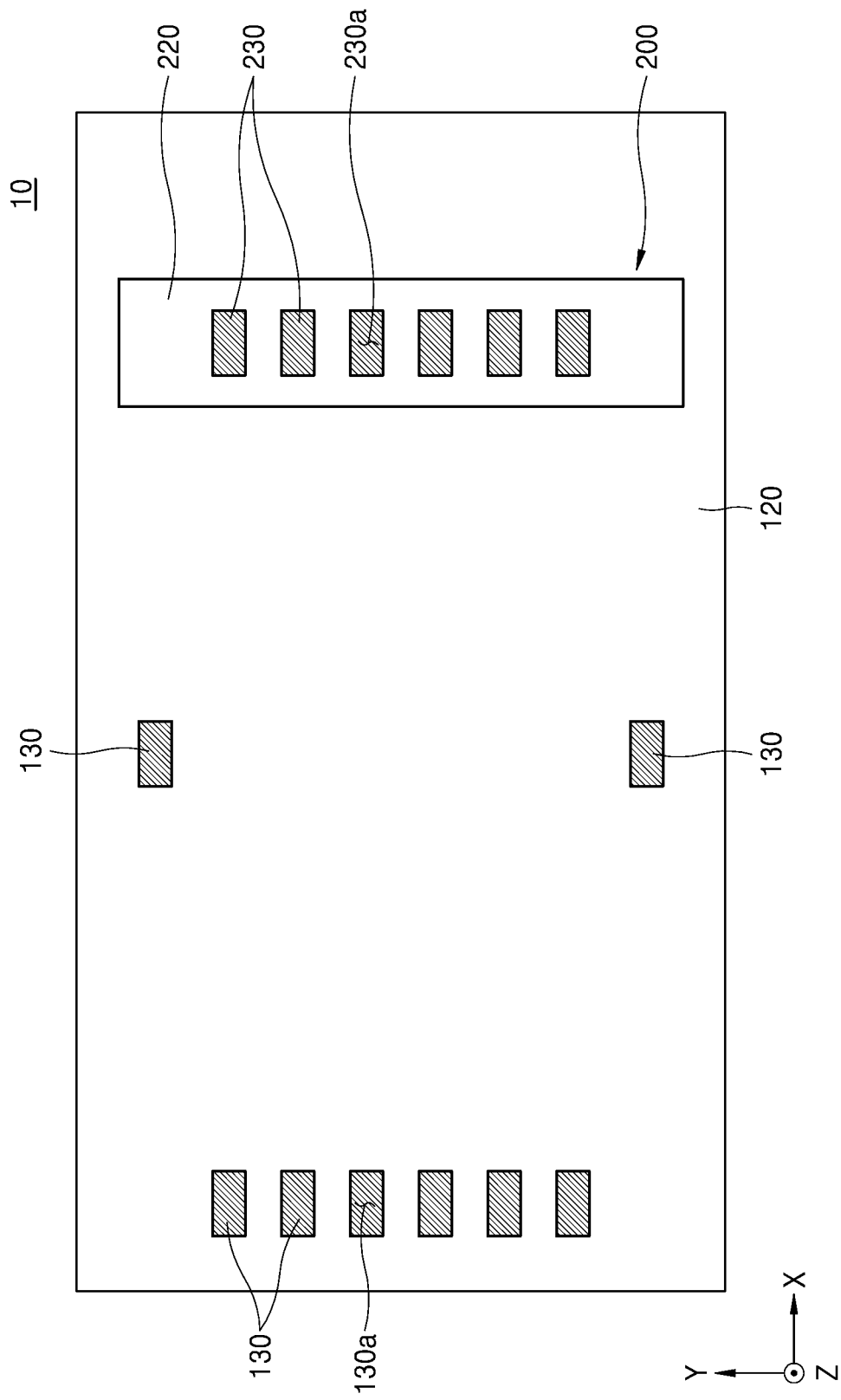

PACKAGE SUBSTRATE AND SEMICONDUCTOR PACKAGE WITH ELEVATED BONDING PAD, AND COMPRISING THE SAME

CROSS-REFERENCE TO RELATED APPLICATION

This application claims priority under 35 U.S.C. § 119 to Korean Patent Application No. 10-2020-0085675, filed on Jul. 10, 2020, in the Korean Intellectual Property Office, the disclosure of which is incorporated by reference herein in its entirety.

BACKGROUND

The inventive concept relates to a package substrate on which a semiconductor chip is mounted and a semiconductor package including the same.

As the storage capacity of the semiconductor package increases, the semiconductor package including the semiconductor chip is desirable to be thin and lightweight. Research is being conducted to include semiconductor chips of various functions in the semiconductor package so that the semiconductor chips operate in high speed.

In response to this trend, the semiconductor package may include a package substrate and a plurality of semiconductor chips mounted on the package substrate, and the plurality of semiconductor chips may be electrically connected to the package substrate through a bonding wire. In recent years, research for improving the reliability of bonding between a bonding wire and a package substrate and research for reducing manufacturing costs of a semiconductor package are active.

SUMMARY

The inventive concept provides a semiconductor package capable of improving the reliability of bonding between a bonding wire and a package substrate.

The inventive concept provides a semiconductor package with reduced manufacturing costs.

According to an exemplary embodiment of the present inventive concept, a package substrate includes a first insulating layer having an upper surface and a lower surface which are opposite to each other, a first redistribution wiring buried in the first insulating layer, a first bonding pad including a lower surface which is connected to a corresponding portion of the first redistribution wiring and is disposed on the upper surface of the first insulating layer, and a first bonding surface opposite to the lower surface of the first bonding pad, and a second, elevated, bonding pad disposed on the upper surface of the first insulating layer. The second bonding pad includes a metal layer disposed on the upper surface of the first insulating layer and connected to a corresponding portion of the first redistribution wiring, and a second bonding pad layer having a lower surface which is connected to the metal layer and a second bonding surface which is opposite to the lower surface of the second bonding pad layer. The metal layer and the second bonding pad layer are stacked on each other such that the metal layer is disposed between the upper surface of the first insulating layer and the lower surface of the second bonding pad layer. The second bonding surface of the second bonding pad layer is higher than the first bonding surface of the first bonding pad.

According to an exemplary embodiment of the present inventive concept, a semiconductor package includes a package substrate including a first insulating layer having an upper surface and a lower surface which are opposite to each other, a first redistribution wiring buried in the first insulating layer, a first bonding pad which is disposed on the upper surface of the first insulating layer, has a first bonding surface, and is connected to a portion of the first redistribution wiring, a second, elevated, bonding pad including a metal layer which is disposed on the upper surface of the first insulating layer and connected to a portion of the first redistribution wiring, and a second bonding pad layer which is disposed on the metal layer and has a second bonding surface higher than the first bonding surface of the first bonding pad, and a second insulating layer protruding from the upper surface of the first insulating layer, and surrounding a side surface of the metal layer and a side surface of the second bonding pad layer. The semiconductor package further includes a first semiconductor chip mounted on the upper surface of the first insulating layer of the package substrate and including a lower chip pad, a second semiconductor chip mounted on the first semiconductor chip and including a first upper chip pad and a second upper chip pad, a first bonding wire connecting the lower chip pad of the first semiconductor chip to the first bonding pad of the package substrate, a second bonding wire connecting the second upper chip pad of the second semiconductor chip to the second bonding pad layer of the second bonding pad, and a third bonding wire connecting the lower chip pad of the first semiconductor chip to the first upper chip pad of the second semiconductor chip.

According to an exemplary embodiment of the present inventive concept, a semiconductor package includes a package substrate including a first insulating layer having an upper surface and a lower surface which are opposite to each other, a first redistribution wiring buried in the first insulating layer, a first bonding pad which is disposed on the upper surface of the first insulating layer, has a first bonding surface, and is connected to a corresponding portion of the first redistribution wiring, a second, elevated, bonding pad disposed on the upper surface of the first insulating layer, and including a metal layer which is disposed on the upper surface of the first insulating layer and is connected to a corresponding portion of the first redistribution wiring, and a second bonding pad layer disposed on the metal layer and having a second bonding surface higher than the first bonding surface of the first bonding pad, and a second insulating layer surrounding a side surface of the second bonding pad layer. The semiconductor package further includes a semiconductor chip mounted on the upper surface of the first insulating layer and having a first chip pad and a second chip pad, a first bonding wire connecting the first chip pad of the semiconductor chip to the first bonding pad of the package substrate, and a second bonding wire connecting the second chip pad of the semiconductor chip to the second bonding pad layer of the second bonding pad of the package substrate.

The package substrate according to an example embodiment may include a protruding bonding layer (i.e., an elevated bonding pad) that partially protrudes from one surface of an insulating layer and has a bonding pad to which a bonding wire is connected. Therefore, the reliability of bonding between the bonding wire and the package substrate may be improved.

Because the package substrate according to an example embodiment may include a protruding bonding layer partially protruding from one surface of an insulating layer, the length of a bonding wire connecting a semiconductor chip to a bonding pad may be shortened. Accordingly, manufacturing costs of a semiconductor package may be reduced.

BRIEF DESCRIPTION OF THE DRAWINGS

Embodiments of the inventive concept will be more clearly understood from the following detailed description taken in conjunction with the accompanying drawings in which:

FIG. 2 is a plan view of a package substrate according to an example embodiment;

DETAILED DESCRIPTION OF THE EMBODIMENTS

Figure 1:
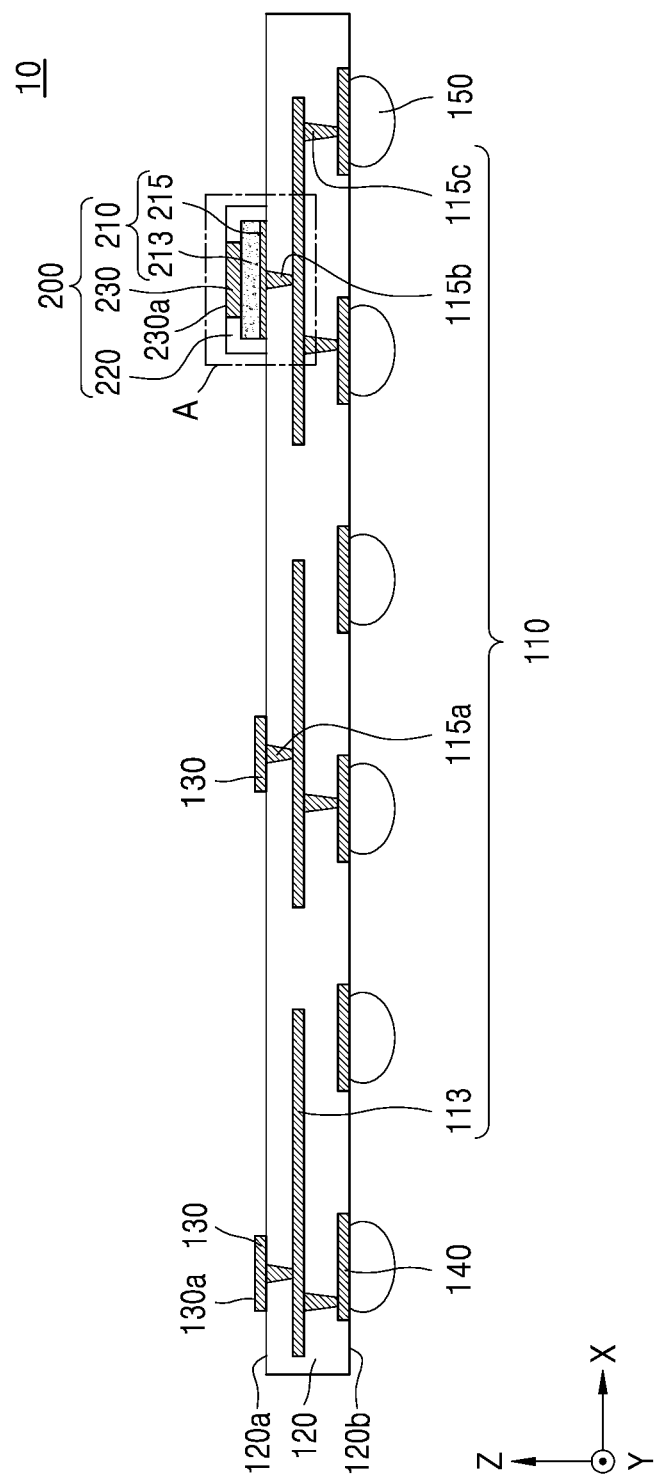
FIG. 1 is a cross-sectional view of a package substrate according to an example embodiment.

Hereinafter, embodiments of the inventive concept will be described in detail with reference to the accompanying drawings. Like reference numerals in the drawings denote like elements, and thus their overlapped explanations are omitted.

Figure 3A:
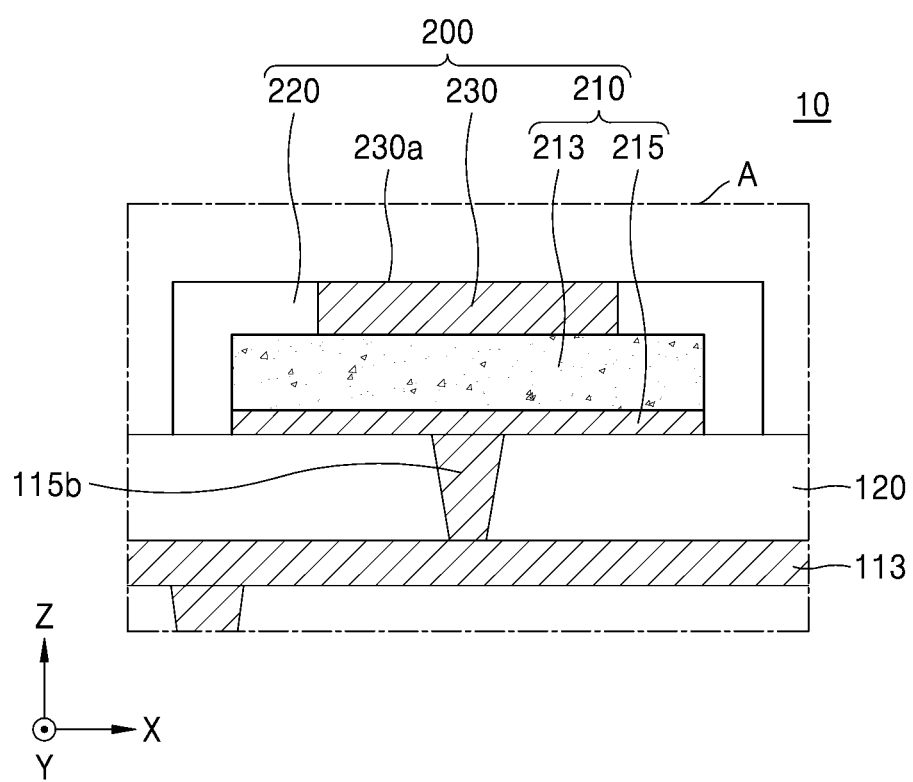
FIG. 3A is an enlarged view of area A of FIG. 1 according to an example embodiment.

FIG. 1 is a cross-sectional view of a package substrate 10 according to an example embodiment, and FIG. 2 is a plan view of the package substrate 10 according to an example embodiment. FIG. 3A is an enlarged view of area A of FIG. 1.

Figure 5:
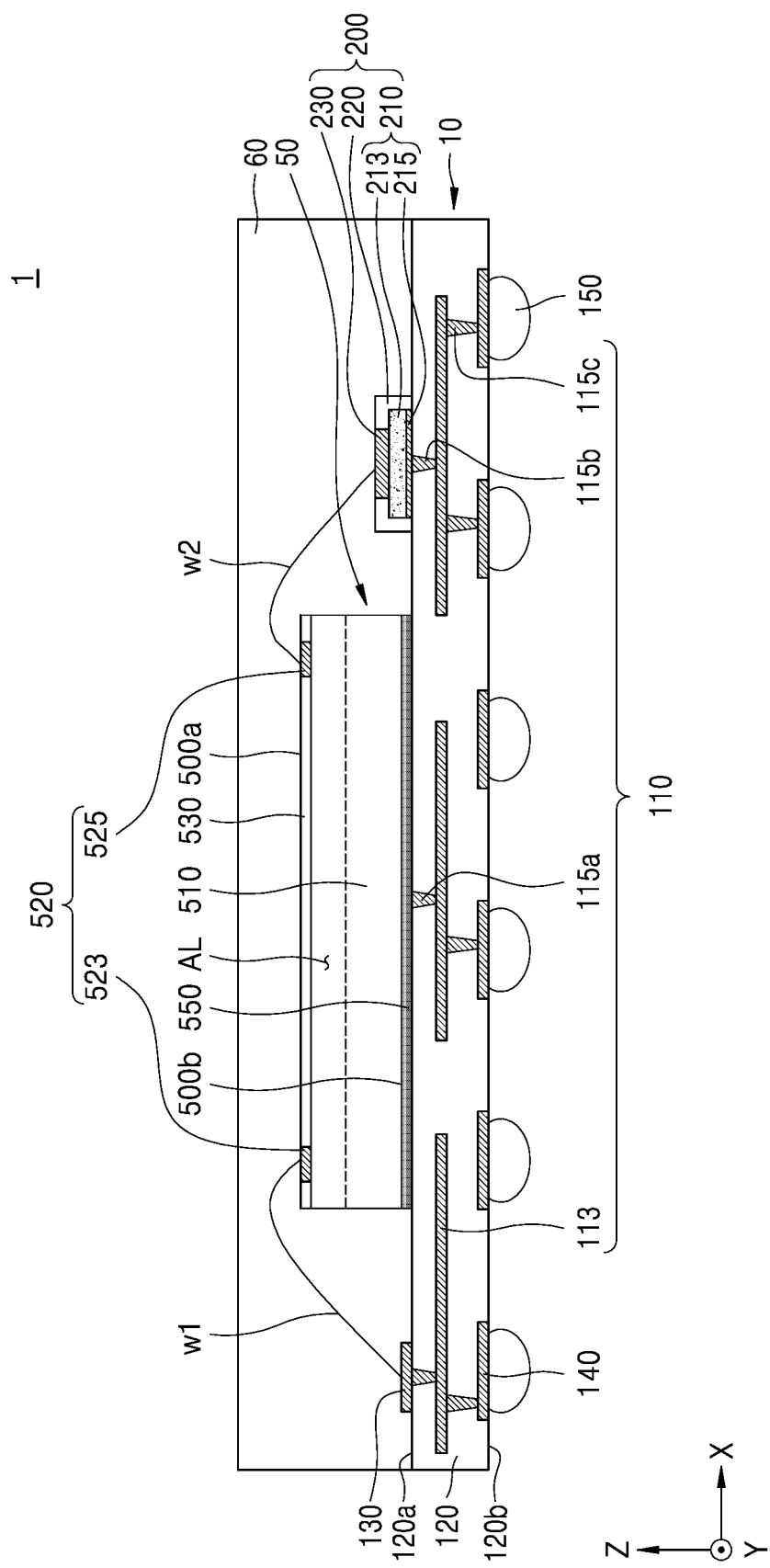
FIG. 5 is a cross-sectional view of a semiconductor package according to an example embodiment.

The package substrate 10 according to an example embodiment may be a substrate for mounting a semiconductor chip 50 (of FIG. 5). In an example embodiment, the package substrate 10 may be a printed circuit board (PCB). However, the package substrate 10 is not limited to the above, and may be a substrate made of a wafer.

Referring to FIGS. 1 to 3 together, the package substrate 10 according to the example embodiment may include a first redistribution pattern 110 (i.e., a first redistribution wiring), a first insulating layer 120, a first bonding pad 130, a protruding bonding layer 200 (i.e., an elevated bonding pad), an external connection pad 140, an external connection terminal 150, and the like. The protruding bonding layer 200 may include a metal layer 210, a second insulating layer 220, and a second bonding pad 230 (i.e., a second bonding pad layer). The various bonding pads of the package substrate 10 described herein may be connected to internal circuitry within a semiconductor device to which they are connected, and may transmit signals and/or supply voltages to and/or from the semiconductor device to which they are attached. For example, bonding pads such as the first bonding pad 130 and the protruding bonding layer 200 disposed on the first insulating layer 120 may connect to the first redistribution pattern 110 and other electrical lines disposed or buried within the first insulating layer 120. At least one semiconductor chip which may be attached to the first insulating layer 120 may include various chip pads which connect to an integrated circuit within at least one semiconductor chip. The various pads, such as the bonding pads and the chip pads, described herein may have a planar surface (i.e., a bonding surface) at a location for connecting to a bonding wire for external communications between the device and the package substrate 10 or between two devices which are stacked on the package substrate 10. The pads may be formed of a conductive material such as metal.

The first insulating layer 120 may form an exterior of the package substrate 10 and may be a layer surrounding the first redistribution pattern 110. The first insulating layer 120 may have an upper surface 120a and a lower surface 120b. The upper surface 120a of the first insulating layer 120 may be a surface adjacent to the first bonding pad 130, and the lower surface 120b may be a surface adjacent to the external connection pad 140 and opposite to the upper surface 120a. In an exemplary embodiment, a surface of the first insulating layer 120 on which the external connection terminal 150 is formed is described as the lower surface 120b, and the opposite side on which the protruding bonding layer 200 is formed is described as the upper surface 120a.

In an example embodiment, the first insulating layer 120 may include or may be formed of oxide or nitride. For example, the first insulating layer 120 may include or may be formed of silicon oxide or silicon nitride.

However, the first insulating layer 120 is not limited to the above, and may include or may be formed of an insulating material such as a photo imageable dielectric (PID) material used for a photolithography process. For example, the first insulating layer 120 may include or may be formed of at least one of photosensitive polyimide (PSPI) and polybenzobisoxazole (PBO).

The first redistribution pattern 110 may be a conductive pattern in the first insulating layer 120 and electrically connected to the first bonding pad 130, the second bonding pad 230, and the external connection pad 140.

In an example embodiment, the first redistribution pattern 110 may include a redistribution line pattern 113 extending in a horizontal direction in the first insulating layer 120, a first redistribution via pattern 115a extending in a vertical direction in the first insulating layer 120 and connecting the redistribution line pattern 113 to the first bonding pad 130, a second redistribution via pattern 115b extending in the vertical direction in the first insulating layer 120 and connecting the redistribution line pattern 113 to the metal layer 210, and a third redistribution via pattern 115c extending in the vertical direction in the first insulating layer 120 and connecting the redistribution line pattern 113 to the external connection pad 140. FIG. 1 shows the redistribution line pattern 113 in a single level. The present inventive concept is not limited thereto. In an exemplary embodiment, a plurality of first redistribution patterns are arranged in a multi-level structure. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer, or section, for example as a naming convention. Thus, a first element, component, region, layer, or section discussed below in one section of the specification could be termed a second element, component, region, layer, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

In an example embodiment, the material of the first redistribution pattern 110 may be copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy thereof, but is not limited thereto.

In an example embodiment, the first redistribution pattern 110 may be buried in the first insulating layer 120. The first redistribution pattern 110 may include the redistribution line pattern 113 buried in the first insulating layer 120, and the first to third redistribution via patterns 115a, 115b, and 115c buried in the first insulating layer 120. The first redistribution pattern 110 may further include a first seed layer (not shown) disposed between the first insulating layer 120 and each of the first to third redistribution via patterns 115a, 115b, and 115c, and between the first insulating layer 120 and the redistribution line pattern 113.

In an example embodiment, the first seed layer may be formed through a physical vapor deposition process, and the redistribution line pattern 113 and the first to third redistribution via patterns 115a, 115b, and 115c may be formed through a plating process using the first seed layer.

In an example embodiment, the first seed layer may include or may be formed of Cu, Ti, TiW, titanium nitride (TiN), Ta, tantalum nitride (TaN), chromium (Cr), Al, or a combination thereof. For example, the first seed layer may be Cu/Ti in which Cu is stacked on Ti, or Cu/TiW in which Cu is stacked on TiW.

For example, when Cu is used as the material of the redistribution line pattern 113 and the first to third redistribution via patterns 115a, 115b, and 115c, at least a portion of the first seed layer may act as a diffusion barrier layer.

The first bonding pad 130 may be a pad that is on the upper surface 120a of the first insulating layer 120 and is electrically connected to the redistribution line pattern 113 by the first redistribution via pattern 115a. A bonding surface 130a of the first bonding pad 130 may be exposed to the outside without being covered by the first insulating layer 120.

In an example embodiment, a side surface of the first bonding pad 130 may be exposed from the first insulating layer 120. However, the inventive concept is not limited thereto, and at least a portion of the side surface of the first bonding pad 130 may be surrounded by the first insulating layer 120.

In an example embodiment, the material of the first bonding pad 130 may be Cu, Al, W, Ti, Ta, In, Mo, Mn, Co, Sn, Ni, Mg, Re, Be, Ga, Ru, or an alloy thereof, but is not limited thereto.

The second insulating layer 220 may be an insulating layer protruding from the upper surface 120a of the first insulating layer 120. In an exemplary embodiment, the second insulating layer 220 may be disposed on the upper surface 120a of the first insulating layer 120. When the second insulating layer 220 is viewed from a plan view, the second insulating layer 220 may be a layer extending in a linear direction on the upper surface 120a of the first insulating layer 120. In an exemplary embodiment, when the second insulating layer 220 is viewed from a plan view, the second insulating layer 220 may be of a rectangular shape with the longest side that extends in a first direction on the upper surface 120a of the first insulating layer 120, and the area of the second insulating layer 220 may be less than the area of the first insulating layer 120.

For example, the second insulating layer 220 may extend in at least one of X and Y directions on the upper surface 120a of the first insulating layer 120. In an exemplary embodiment, the first direction in which the longest side of the second insulating layer 220 extends is in parallel to one of X and Y directions on the upper surface 120a of the first insulating layer 120. The present inventive concept is not limited thereto. The first direction in which the longest side of the second insulating layer 220 extends may be a direction between the X and Y directions. The outer appearance of the package substrate 10 may have a shape in which an upper portion of the package substrate 10 protrudes convexly from the first insulating layer 120 by the second insulating layer 220. In an exemplary embodiment, the second insulating layer 220 may be disposed on a portion of the first insulating layer 120 such that the outer appearance of the combined structure of the first insulating layer 120 and the second insulating layer 220 has a protrusion from the upper surface 120a of the first insulating layer 120. The protrusion corresponds to the second insulating layer 220.

In an example embodiment, the material of the second insulating layer 220 may be substantially the same as the material of the first insulating layer 120. For example, the second insulating layer 220 may include or may be formed of oxide (e.g., silicon oxide) or nitride (e.g., silicon nitride). Terms such as "same," "equal," "planar," or "coplanar," as used herein when referring to material, orientation, layout, location, shapes, sizes, amounts, or other measures do not necessarily mean an exactly identical material, orientation, layout, location, shape, size, amount, or other measure, but are intended to encompass nearly identical material, orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second insulating layer 220 may include an insulating material made of a PID material capable of a photolithography process. For example, the second insulating layer 220 may include at least one of PSPI and PBO.

In an example embodiment, the second insulating layer 220 is on the first insulating layer 120 and may surround a side surface of the second bonding pad 230. A bonding surface 230a of the second bonding pad 230 may be exposed to the outside without being covered by the second insulating layer 220.

In an example embodiment, the second insulating layer 220 may contact the first insulating layer 120 and surround the metal layer 210 and the second bonding pad 230. For example, the second insulating layer 220 may cover both a side surface and an upper surface of the metal layer 210 such that the metal layer 210 is not exposed. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second insulating layer 220 may surround the side surface of the second bonding pad 230 on an upper portion of the metal layer 210 and expose the bonding surface 230a of the second bonding pad 230 to the outside. For example, an upper surface of the second insulating layer 220 may be on the same plane as the bonding surface 230a of the second bonding pad 230.

The metal layer 210 may be a layer on the first insulating layer 120 and electrically connected to the first redistribution pattern 110. For example, the metal layer 210 may be electrically connected to the redistribution line pattern 113 by the second redistribution via pattern 115b.

In an example embodiment, the metal layer 210 may protrude from the upper surface 120a of the first insulating layer 120. In other words, the metal layer 210 may be provided only on a portion of the upper surface 120a of the first insulating layer 120. The package substrate 10 may have a shape protruding upward from a portion where the metal layer 210 is provided.

In an example embodiment, the metal layer 210 may include a second redistribution pattern 213 and a second seed layer 215. The second redistribution pattern 213 extends in a horizontal direction on the first insulating layer 120 and may be a pattern including a conductive material. The second redistribution pattern 213 may be electrically connected to the first redistribution pattern 110 by the second redistribution via pattern 115b.

In an example embodiment, the material of the second redistribution pattern 213 may be Cu, Al, W, Ti, Ta, In, Mo, Mn, Co, Sn, Ni, Mg, Re, Be, Ga, Ru, or an alloy thereof, but is not limited thereto.

The second seed layer 215 may be between the second redistribution pattern 213 and the first insulating layer 120. The second seed layer 215 may be formed through a physical vapor deposition process, and the second redistribution pattern 213 may be formed through a plating process.

In an example embodiment, the second seed layer 215 may include Cu, Ti, TiW, TiN, Ta, TaN, Cr, Al, or a combination thereof. For example, the second seed layer 215 may be Cu/Ti in which Cu is stacked on Ti, or Cu/TiW in which Cu is stacked on TiW. When Cu is used as the material of the second redistribution pattern 213, at least a portion of the second seed layer 215 may function as a diffusion barrier layer.

In an example embodiment, the second redistribution pattern 213 and the second seed layer 215 of the metal layer 210 may be surrounded by the second insulating layer 220. Accordingly, the metal layer 210 is not exposed to the outside.

In an example embodiment, when the package substrate 10 is viewed from a plan view, the first redistribution pattern 110 may be formed within the entire area of the package substrate 10, but the second redistribution pattern 213 may be formed within only one area of the package substrate 10.

For example, the first redistribution pattern 110 may be formed on both the center and the edge of the package substrate 10, but the second redistribution pattern 213 may be formed only on the edge of the package substrate 10.

The second bonding pad 230 may be a pad that passes through the second insulating layer 220 and is connected to the metal layer 210. The side surface of the second bonding pad 230 may be surrounded by the second insulating layer 220, and the bonding surface 230a of the second bonding pad 230 may be exposed to the outside by the second insulating layer 220.

Figure 3B:
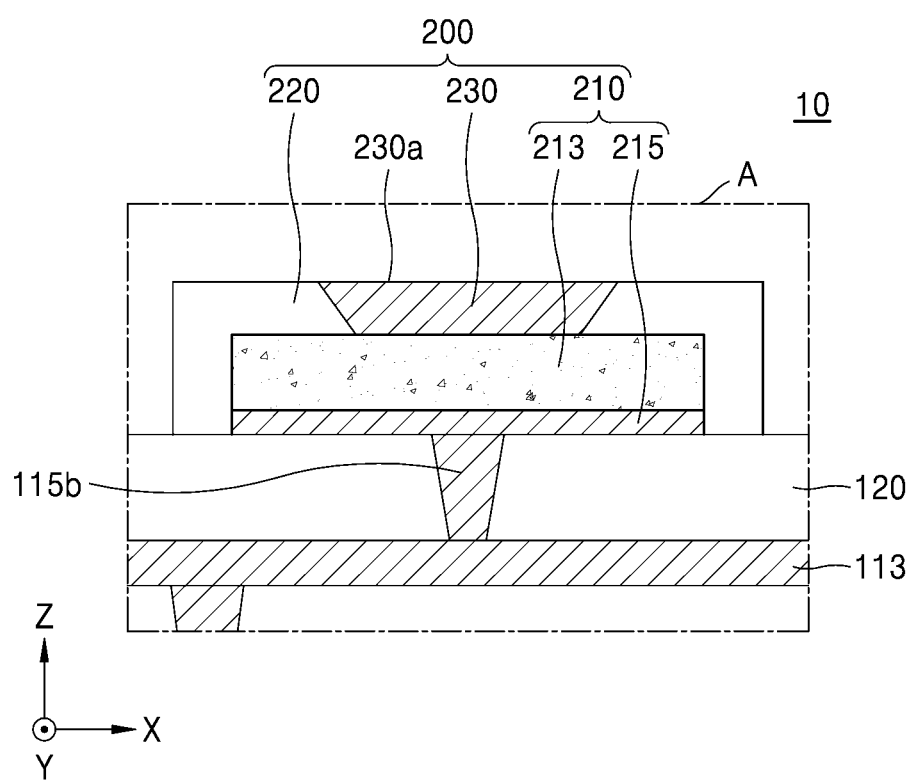
FIG. 3B is an enlarged view of area A of FIG. 1 according to an example embodiment.

As shown in FIG. 3A, the second bonding pad 230 may have a uniform cross-sectional area in the horizontal direction. The present invention is not limited thereto. In an example embodiment as shown in FIG. 3B, the second bonding pad 230 may have a tapered shape in which a cross-sectional area of the second bonding pad 230 in a horizontal direction (i.e., the cross-sectional area on an X-Y plane) decreases downwards (i.e., as the second bonding pad 230 approaches the metal layer 210).

The material of the second bonding pad 230 may be Cu, Al, W, Ti, Ta, In, Mo, Mn, Co, Sn, Ni, Mg, Re, Be, Ga, Ru, or an alloy thereof, but is not limited thereto.

The protruding bonding layer 200 (i.e., the elevated bonding pad) of the package substrate 10 may include the metal layer 210, the second insulating layer 220, and the second bonding pad 230 (i.e., the second bonding pad layer) as described above. The protruding bonding layer 200 may be a layer protruding upward from the upper surface 120a of the first insulating layer 120. The protruding bonding layer 200 may be a layer which is in contact with a bonding wire w2 (of FIG. 5) connecting the package substrate 10 to the semiconductor chip 50 (of FIG. 5).

In an example embodiment, a thickness of the package substrate 10 (i.e., a length of the package substrate 10 in a Z direction) may be about 0.08 mm to about 0.13 mm. A thickness of the protruding bonding layer 200 of the package substrate 10 may be about 0.02 mm to about 0.04 mm. The protruding bonding layer 200 may protrude from about 0.02 mm to about 0.04 mm in the vertical direction (Z direction) from the upper surface 120a of the first insulating layer 120. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In an example embodiment, when the package substrate 10 is viewed from a plan view, the protruding bonding layer 200 may be provided outside the semiconductor chip 50 (of FIG. 5) mounted on the package substrate 10. The protruding bonding layer 200 may be located closer to the edge of the package substrate 10.

In an example embodiment, when the package substrate 10 is viewed from a plan view, the protruding bonding layer 200 may extend in a linear direction on the upper surface 120a of the first insulating layer 120. For example, the protruding bonding layer 200 may extend in at least one of the X and Y directions on the upper surface 120a of the first insulating layer 120. In an exemplary embodiment, when the package substrate 10 is viewed from a plan view, the protruding bonding layer 200 may be of a rectangular shape with the longest side which extends in a first direction on the upper surface 120a of the first insulating layer 120, and the area of the protruding bonding layer 200 may be less than the area of the first insulating layer 120. In an exemplary embodiment, the first direction in which the longest side of the protruding bonding layer 200 extends is in parallel to one of X and Y directions on the upper surface 120a of the first insulating layer 120 The present inventive concept is not limited thereto. The first direction in which the longest side of the protruding bonding layer 200 extends may be a direction between the X and Y directions.

In an example embodiment, the extending direction of the protruding bonding layer 200 may be a direction parallel to an extending direction of a side surface of the first insulating layer 120. The extending direction of the protruding bonding layer 200 may be a direction parallel to an extending direction of a side surface of the semiconductor chip 50 (of FIG. 5) mounted on the package substrate 10.

For example, when side surfaces of the semiconductor chip 50 (of FIG. 5) extend in the X and Y directions, the protruding bonding layer 200 may extend in at least one of the X and Y directions on the upper surface 120a of the first insulating layer 120.

When the side surfaces of the semiconductor chip 50 extend in a first direction deviated from the X and Y directions, the protruding bonding layer 200 may extend in a direction parallel to the first direction on the upper surface 120a of the first insulating layer 120.

The external connection pad 140 may be a pad that functions as under bump metallurgy (UBM) for arranging the external connection terminal 150. The external connection pad 140 may be electrically connected to the redistribution line pattern 113 by the third redistribution via pattern 115c.

In an example embodiment, the material of the external connection pad 140 may be Cu, Al, W, Ti, Ta, In, Mo, Mn, Co, Sn, Ni, Mg, Re, Be, Ga, Ru, or an alloy thereof, but is not limited thereto.

The external connection terminal 150 is connected to the external connection pad 140 and may be a terminal for connecting the package substrate 10 to an external device. The external connection terminal 150 may be a metal material including at least one of silver (Ag), Cu, and Al.

A package substrate according to the comparative example may include a plurality of bonding pads, which all have the same configuration as each other, for electrically connecting to a semiconductor chip. The plurality of bonding pads may be electrically connected to the semiconductor chip by a bonding wire.

In the case of the package substrate according to the comparative example, as redistribution patterns in the package substrate become more complex, positions where the plurality of bonding pads are formed may be limited. For example, as redistribution patterns in the package substrate become more complex, a plurality of bonding pads may be provided on the outermost portion of the package substrate. When multiple semiconductor chips which are stacked on the package substrate in various stacking arrangements are manufactured, the redistribution patterns in the package substrate for each stacking arrangement may be re-designed to secure reliable wire bonding between the package substrate and the multiple semiconductor chips. Such re-design of the package substrate or using the comparative package substrate may increase manufacturing costs.

As a plurality of bonding pads are provided on the outermost portion of a package substrate, and a plurality of semiconductor chips are stacked in a vertical direction on the package substrate, the length of a bonding wire connecting a semiconductor chip to a bonding pad may gradually increase.

Accordingly, in the case of a semiconductor package including the package substrate according to the comparative example, the reliability of bonding between a bonding wire and a bonding pad may be weak. Because a bonding wire may include an expensive metal material (e.g., Au, Ag, etc.), manufacturing costs of a semiconductor package may increase as a length of the bonding wire increases.

The package substrate 10 according to an example embodiment may include the protruding bonding layer 200 protruding from the upper surface 120a of the first insulating layer 120 as described above.

Figure 4:
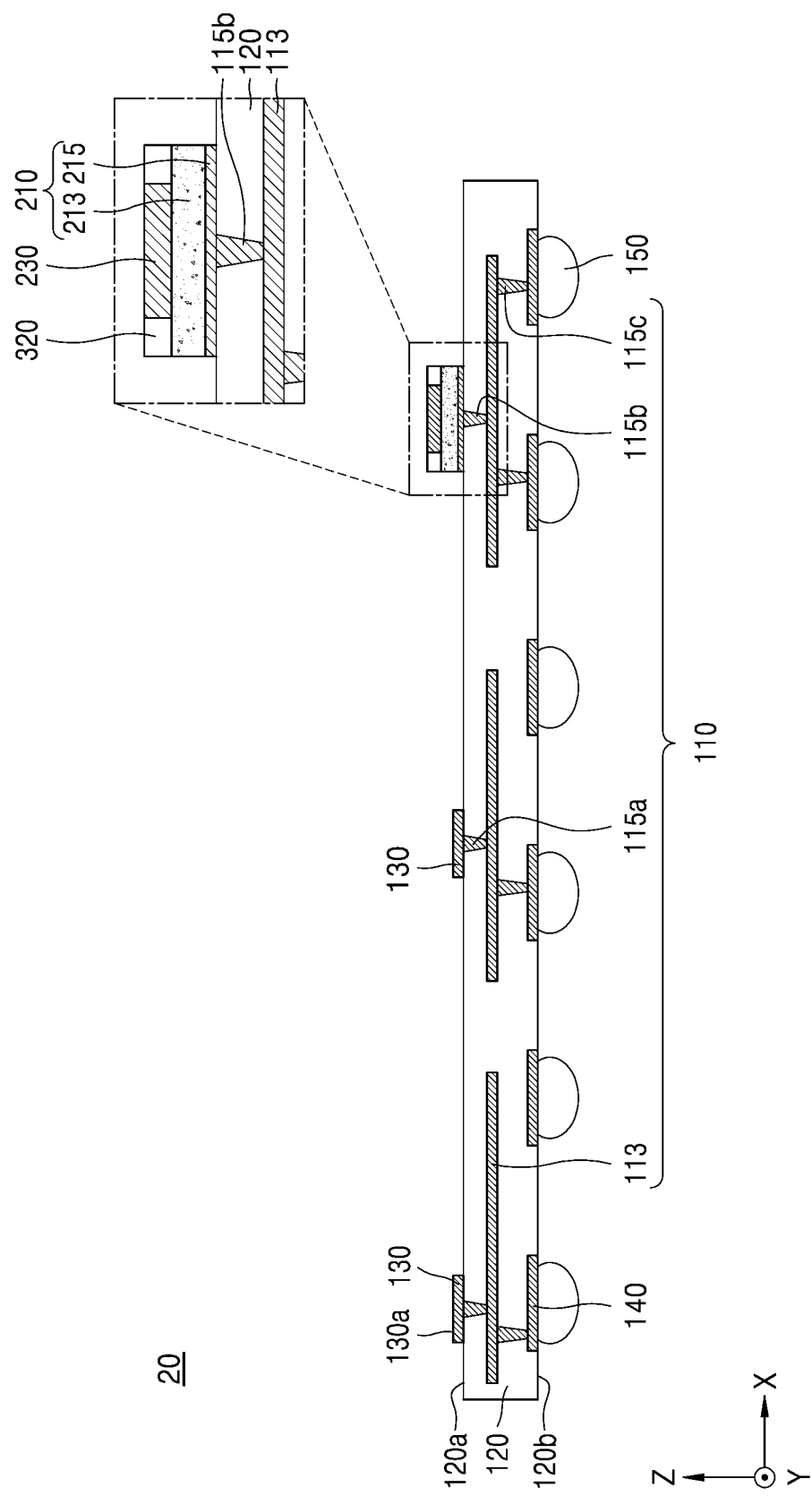
FIG. 4 is a cross-sectional view of a package substrate according to an example embodiment.

Because the protruding bonding layer 200 may include the metal layer 210 and the second bonding pad 230 electrically connected to the first redistribution pattern 110 on the first insulating layer 120, positional constraints of the protruding bonding layer 200 may be relaxed. For example, the protruding bonding layer 200 may be formed on the first insulating layer 120 such that any portion of a bottom surface of the protruding bonding layer 200 (e.g., an edge portion of the bottom surface of the protruding bonding layer 200 or the center portion of the bottom surface of the protruding bonding layer 200) may be connected to the second redistribution via pattern 115b of the first redistribution pattern 110. Since the area of the metal layer 210 is greater than an area of the second bonding pad 230, the metal layer 210 of the protruding bonding layer 200 may allow wire bonding between the package substrate 10 and the multiple semiconductor chips stacked on the package substrate 10 in various stacking arrangements, without re-design of the first redistribution pattern 110. For the brevity of drawings, FIG. 4 shows that the center portion of the bottom surface of the protruding bonding layer 200 is connected to the second redistribution via pattern 115b. For secure wire bonding, any portion of the bottom surface of the protruding bonding layer 200 may be connected to the second redistribution via pattern 115b. Such change in the position of the protruding bonding layer 200 relative to the second redistribution via pattern 115b may be obtained simply by changing a photomask for forming the protruding bonding layer 200, without necessarily changing at least one photomask for forming the first redistribution pattern 110.

The level of the bonding surface 230a of the second bonding pad 230 of the package substrate 10 may be higher than the level of the bonding surface 130a of the first bonding pad 130. A level of a bonding surface may be defined as a length formed by the bonding surface in the vertical direction (Z direction) from the upper surface 120a of the first insulating layer 120.

Accordingly, a length of the bonding wire w2 (of FIG. 5) connecting the semiconductor chip 50 (of FIG. 5) to the second bonding pad 230 may be shortened, so that the manufacturing costs of a semiconductor package 1 (of FIG. 5) may be reduced. The reliability of bonding between the bonding wire w2 and the second bonding pad 230 may be improved.

FIG. 4 is a cross-sectional view of a package substrate 20 according to an example embodiment.

The package substrate 20 of FIG. 4 may include the first redistribution pattern 110, the first insulating layer 120, the first bonding pad 130, the metal layer 210, a second insulating layer 320, the second bonding pad 230, the external connection pad 140, the external connection terminal 150, and the like.

Hereinafter, repeated descriptions of the package substrate 10 of FIG. 1 and the package substrate 20 of FIG. 4 will be omitted, and differences will be mainly described.

Referring to FIG. 4, the second insulating layer 320 is on the metal layer 210 and may surround the second bonding pad 230. In an example embodiment, the second insulating layer 320 is not in contact with the first insulating layer 120, and a side surface of the second insulating layer 320 may be on the same plane as a side surface of the metal layer 210.

For example, the side surface of the second insulating layer 320 and the side surface of the metal layer 210 may be coplanar with each other in a vertical direction. Accordingly, the side surface of the metal layer 210 may be exposed to the outside.

In an example embodiment, an upper surface of the second insulating layer 320 may be on the same plane as an upper surface of the second bonding pad 230. However, the inventive concept is not limited to the above, and the level of the upper surface of the second insulating layer 320 may be lower than the level of the upper surface of the second bonding pad 230, and the second insulating layer 320 may cover only at least a portion of the side surface of the second bonding pad 230.

Figure 6:
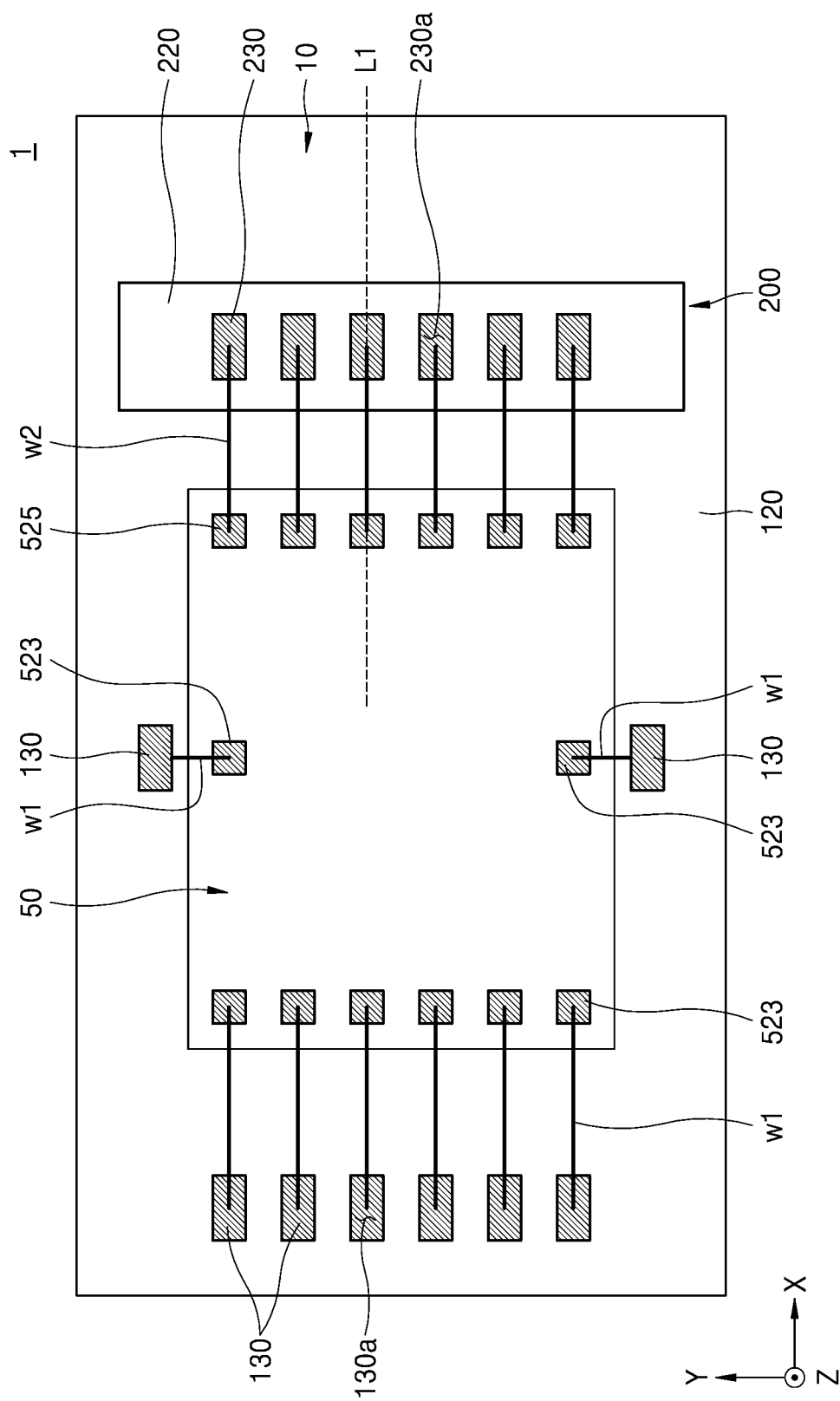
FIG. 6 is a plan view illustrating an interior of a semiconductor package according to an example embodiment.

FIG. 5 is a cross-sectional view of the semiconductor package 1 according to an example embodiment, and FIG. 6 is a plan view illustrating an interior of the semiconductor package 1 according to an example embodiment.

Referring to FIGS. 5 and 6 together, the semiconductor package 1 may include the package substrate 10, the semiconductor chip 50, a first bonding wire w1, the second bonding wire w2, and a molding layer 60.

The package substrate 10 may include the first redistribution pattern 110, the first insulating layer 120, the first bonding pad 130, the metal layer 210, the second insulating layer 220, the second bonding pad 230, the external connection pad 140, the external connection terminal 150, and the like. Because the technical concept of the package substrate 10 overlaps with the descriptions given with reference to FIGS. 1 to 3, detailed information will be omitted.

The semiconductor chip 50 may be mounted on the package substrate 10. The semiconductor chip 50 may have a first surface 500a and a second surface 500b facing the first surface 500a. The first surface 500a may be an upper surface of the semiconductor chip 50, and the second surface 500b may be a lower surface of the semiconductor chip 50. The second surface 500b of the semiconductor chip 50 may be fixed to one surface of the package substrate 10 by an adhesive layer 550.

In an example embodiment, the semiconductor chip 50 may include a logic semiconductor chip. The logic semiconductor chip may include, for example, a logic semiconductor chip such as a central processor unit (CPU), a microprocessor unit (MPU), a graphics processor unit (GPU), or an application processor (AP).

The semiconductor chip 50 may include a memory semiconductor chip. The memory semiconductor chip may include, for example, a volatile memory semiconductor chip such as dynamic random access memory (DRAM) or static random access memory (SRAM), or may include a nonvolatile memory semiconductor chip such as phase-change random access memory (PRAM), magneto-resistive random access memory (MRAM), ferroelectric random access memory (FeRAM) or a resistive random access memory (RRAM).

In an example embodiment, the semiconductor chip 50 may include a semiconductor substrate 510, a chip pad 520, and a passivation layer 530. The semiconductor substrate 510 may have an active layer AL in a portion adjacent to the first surface 500a.

In an example embodiment, the active layer AL may include a plurality of individual devices of various types. For example, the plurality of individual devices may include various microelectronic devices, for example, an image sensor such as a complementary metal-oxide semiconductor (CMOS) transistor, a metal-oxide-semiconductor filed effect transistor (MOSFET), system large scale integration (LSI), and a CMOS imaging sensor (CIS), a micro-electro-mechanical system (MEMS), an active device, and a passive device.

In an example embodiment, the material of the semiconductor substrate 510 may include silicon (Si). The semiconductor substrate 510 may include a semiconductor element such as germanium (Ge) or a compound such as silicon carbide (SiC), gallium arsenide (GaAs), indium arsenide (InAs), and indium phosphide (InP). However, the material of the semiconductor substrate 510 is not limited to the above.

The chip pad 520 is on the semiconductor substrate 510 and may be a pad electrically connected to a plurality of individual devices in the active layer AL. The chip pad 520 may be provided on the edge of the semiconductor substrate 510.

In an example embodiment, the material of the chip pad 520 may be Ni, Cu, gold (Au), Ag, Al, W, Ti, Ta, In, Mo, Mn, Co, Sn, Mg, Re, Be, Ga, and Ru, or an alloy thereof. However, the material of the chip pad 520 is not limited to the above.

In an example embodiment, the chip pad 520 may include a first chip pad 523 and a second chip pad 525. The first chip pad 523 may be a pad connected to the first bonding pad 130 of the package substrate 10, and the second chip pad 525 may be a pad connected to the second bonding pad 230 of the package substrate 10.

The passivation layer 530 is on the semiconductor substrate 510 and may surround a side surface of the chip pad 520. The passivation layer 530 may expose a bonding surface of the chip pad 520. In an example embodiment, a passivation layer 117 may include an insulating material such as an insulating polymer.

The first bonding wire w1 may be a conductive wire connecting the first chip pad 523 of the semiconductor chip 50 to the first bonding pad 130 of the package substrate 10. Also, the second bonding wire w2 may be a conductive wire connecting the second chip pad 525 of the semiconductor chip 50 to the second bonding pad 230 of the package substrate 10.

The first bonding wire w1 and the second bonding wire w2 may include or may be formed of at least one of Au, Ag, platinum (Pt), Al, Cu, palladium (Pd), Ni, Co, Cr, and Ti.

The molding layer 60 is on the package substrate 10 and may surround the semiconductor chip 50, the first bonding wire w1, and the second bonding wire w2. The molding layer 60 may be a material including at least one of an insulating polymer and an epoxy resin. For example, the molding layer 60 may include or may be formed of an epoxy-molding compound (EMC).

As shown in FIG. 6, when the package substrate 10 is viewed from a plan view, the protruding bonding layer 200 may extend in a linear direction on the upper surface 120a of the first insulating layer 120. For example, the protruding bonding layer 200 may extend in a direction parallel to an extending direction of a side surface of the semiconductor chip 50 mounted on the package substrate 10. In an exemplary embodiment, when the package substrate 10 is viewed from a plan view, the protruding bonding layer 200 may be of a rectangular shape with the longest side which extends in a first direction on the upper surface 120a of the first insulating layer 120, and the area of the protruding bonding layer 200 may be less than the area of the first insulating layer 120. In an exemplary embodiment, the first direction in which the longest side of the protruding bonding layer 200 extends is parallel to the extending direction of a side surface of the semiconductor chip 50.

For example, when side surfaces of the semiconductor chip 50 extend in the X and Y directions, the protruding bonding layer 200 may extend in at least one of the X and Y directions on the upper surface 120a of the first insulating layer 120. In an exemplary embodiment, the first direction in which the longest side of the protruding bonding layer 200 extends is parallel to one of X and Y directions on the upper surface 120a of the first insulating layer 120. The present inventive concept is not limited thereto. The first direction in which the longest side of the protruding bonding layer 200 extends may be a direction between the X and Y directions.

However, the inventive concept is not limited to the above, and when the side surfaces of the semiconductor chip 50 extend in a first direction deviated from the X and Y directions, the protruding bonding layer 200 may extend in a direction parallel to the first direction on the upper surface 120a of the first insulating layer 120.

In an example embodiment, a plurality of second chip pads 525 may be provided, and the plurality of second chip pads 525 may be arranged in a direction parallel to an extending direction of a side surface of the semiconductor chip 50. For example, as a side surface of the semiconductor chip 50 extends in the Y direction, the plurality of second chip pads 525 may be arranged in the Y direction.

In an example embodiment, a plurality of second bonding pads 230 of the protruding bonding layer 200 may be provided to correspond to the second chip pad 525. The plurality of second bonding pads 230 may be arranged in a direction parallel to a direction in which the plurality of second chip pads 525 are arranged. For example, as the plurality of second chip pads 525 are arranged in the Y direction, the plurality of second bonding pads 230 may also be arranged in the Y direction.

In an example embodiment, a position of the second bonding pad 230 in the Y direction may be determined such that a straight line L1 connecting the center of the second bonding pad 230 to the center of the second chip pad 525 is perpendicular to a direction in which the plurality of second chip pads 525 are arranged (e.g., the Y direction). In an exemplary embodiment, the position of the second bonding pad 230 in the Y direction may be determined such that a linear distance between the center of the second bonding pad 230 and the center of the second chip pad 525 is the shortest distance among various distances at which reliable wire bonding between the second bonding pad 230 and its corresponding chip pad (e.g., the second chip pad 525) may be obtained. The present invention is not limited thereto. The linear distance between the center of the second bonding pad 230 and the center of the second chip pad 525 may be one of the various distances at which the reliable wire bonding is obtained.

In an example embodiment, an extending direction (X direction) of the second bonding wire w2 may be perpendicular to the direction (Y direction) in which the plurality of second chip pads 525 are arranged and the direction (Y direction) in which the plurality of second bonding pads 230 are arranged. The extending direction (X direction) of the second bonding wire w2 may be parallel to an extending direction (X direction) of the straight line L1 between the center of the second bonding pad 230 and the center of the second chip pad 525.

The second bonding wire w2 may connect the center of the second chip pad 525 to the center of the second bonding pad 230 with the shortest distance among various distances at which reliable wire bonding between the second bonding pad 230 and its corresponding chip pad (e.g., the second chip pad 525) may be obtained. Accordingly, a length of the second bonding wire w2 may be shortened, and the manufacturing costs of the semiconductor package 1 may be reduced. The present invention is not limited thereto. The linear distance between the center of the second bonding pad 230 and the center of the second chip pad 525 may be one of the various distances at which the reliable wire bonding is obtained.

Twisting of the second bonding wire w2 may be suppressed, and the reliability of bonding between the second bonding wire w2 and the second bonding pad 230 may be improved.

Figure 7:
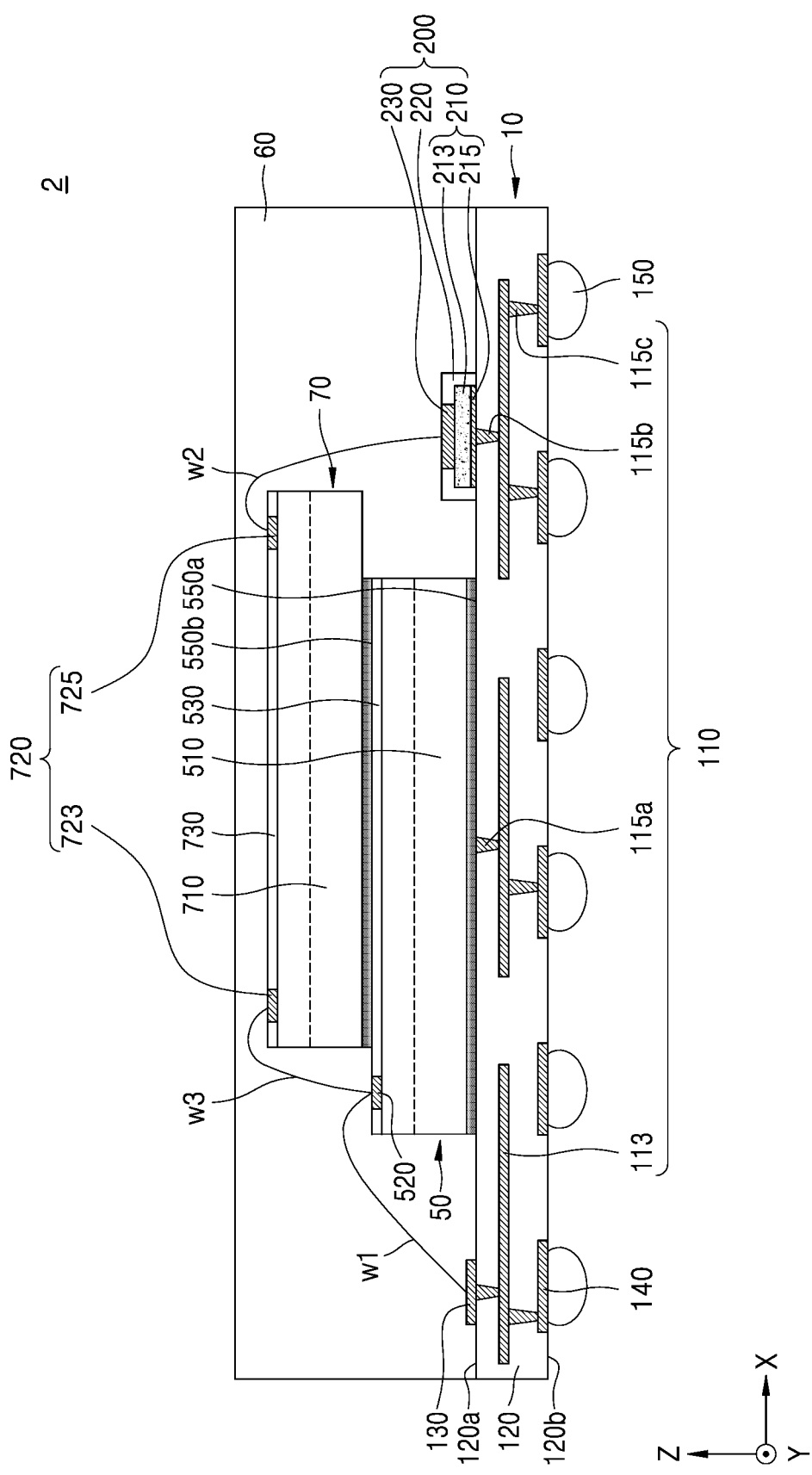
FIG. 7 is a cross-sectional view of a semiconductor package according to an example embodiment.
Figure 8:
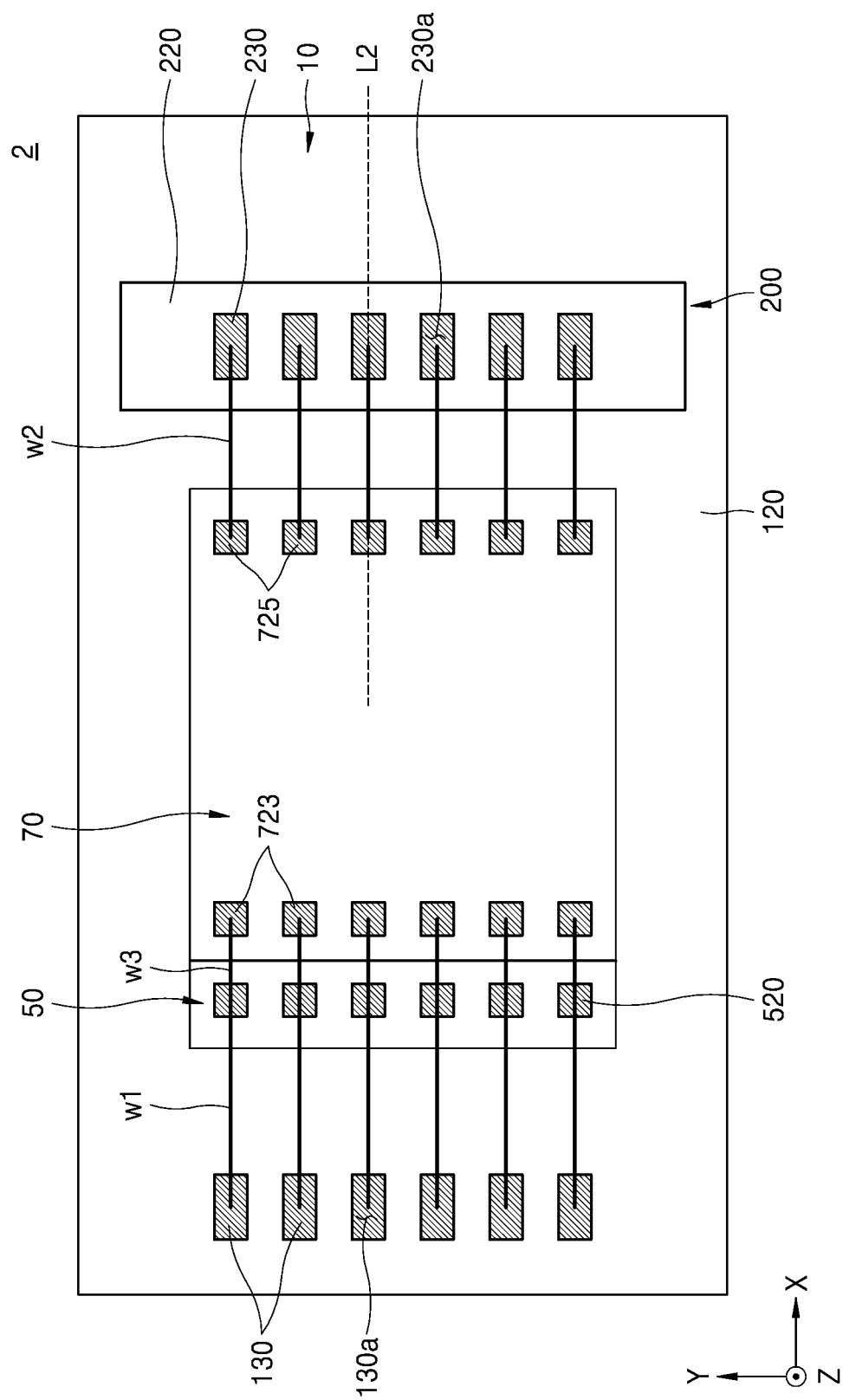
FIG. 8 is a plan view illustrating an interior of a semiconductor package according to an example embodiment.

FIG. 7 is a cross-sectional view of a semiconductor package 2 according to an example embodiment, and FIG. 8 is a plan view illustrating an interior of the semiconductor package 2 according to an example embodiment.

Referring to FIGS. 7 and 8 together, the semiconductor package 2 according to an example embodiment may include the package substrate 10, the first semiconductor chip 50, a second semiconductor chip 70, first to third bonding wires w1, w2, and w3, and the molding layer 60.

Hereinafter, differences between the semiconductor package 1 of FIGS. 5 and 6 and the semiconductor package 2 of FIGS. 7 and 8 will be mainly described.

The first semiconductor chip 50 may be fixed to one surface of the package substrate 10 by a first adhesive layer 550a, and the second semiconductor chip 70 may be fixed to one surface of the first semiconductor chip 50 by a second adhesive layer 550b.

In an example embodiment, the second semiconductor chip 70 may be mounted on the first semiconductor chip 50 such that a side surface of the second semiconductor chip 70 is not on the same plane as a side surface of the first semiconductor chip 50. For example, the stacking arrangement of the first semiconductor chip 50 and the second semiconductor chip 70 may be such that the second semiconductor chip 70 is horizontally shifted relative to the first semiconductor chip 50. The bottom surface of the second semiconductor chip 70 may extend beyond the side surface of the first semiconductor chip 50. Accordingly, the lower chip pad 520 of the first semiconductor chip 50 may be exposed without being covered by the second semiconductor chip 70.

In an example embodiment, the first semiconductor chip 50 and the second semiconductor chip 70 may be heterogeneous semiconductor chips. For example, the semiconductor package 2 may be a system in package (SIP) in which different types of semiconductor chips 50 and 70 are electrically connected to each other to operate as a single system.

For example, when the first semiconductor chip 50 is a memory semiconductor chip, the second semiconductor chip 70 may be a logic semiconductor chip. Further, when the first semiconductor chip 50 is a logic semiconductor chip, the second semiconductor chip 70 may be a memory semiconductor chip.

In an example embodiment, the first semiconductor chip 50 may include the semiconductor substrate 510, the lower chip pad 520, and the passivation layer 530, and the second semiconductor chip 70 may include a second semiconductor substrate 710, an upper chip pad 720, and a second passivation layer 730.

In an example embodiment, the lower chip pad 520 of the first semiconductor chip 50 may be a pad connected to the first bonding pad 130 of the package substrate 10.

Further, the upper chip pad 720 of the second semiconductor chip 70 may include a first upper chip pad 723 electrically connected to the lower chip pad 520 of the first semiconductor chip 50, and a second upper chip pad 725 connected to the second bonding pad 230 of the package substrate 10.

In an example embodiment, the lower chip pad 520 of the first semiconductor chip 50 may be electrically connected to the first bonding pad 130 of the package substrate 10 by the first bonding wire w1.

Further, the second upper chip pad 725 of the second semiconductor chip 70 may be electrically connected to the second bonding pad 230 of the package substrate 10 by the second bonding wire w2. The lower chip pad 520 of the first semiconductor chip 50 and the first upper chip pad 723 of the second semiconductor chip 70 may be electrically connected to each other by the third bonding wire w3.

In an example embodiment, a plurality of second upper chip pads 725 of the second semiconductor chip 70 may be provided, and the plurality of second upper chip pads 725 may be arranged in a direction parallel to an extending direction of the side surface of the second semiconductor chip 70. For example, as the side surface of the second semiconductor chip 70 extends in the Y direction, the plurality of second upper chip pads 725 may be arranged to extend in the Y direction.

In an example embodiment, a plurality of second bonding pads 230 of the protruding bonding layer 200 may be provided to correspond to the second chip pad 525. The plurality of second bonding pads 230 may be arranged in a direction parallel to an extending direction of the plurality of second chip pads 525. For example, as the plurality of second chip pads 525 extend in the Y direction, the plurality of second bonding pads 230 may also be arranged to extend in the Y direction.

In an example embodiment, a position of the second bonding pad 230 in the Y direction may be determined such that a straight line L2 connecting the center of the second bonding pad 230 to the center of the second upper chip pad 725 is perpendicular to an extending direction of the plurality of second chip pads 525 (e.g., the Y direction). In other words, the position of the second bonding pad 230 in the Y direction may be determined such that a linear distance between the center of the second bonding pad 230 and the center of the second chip pad 525 may be the shortest distance among various distances at which reliable wire bonding between the second bonding pad 230 and its corresponding chip pad (e.g., the second chip pad 525) may be obtained. The present invention is not limited thereto. The linear distance between the center of the second bonding pad 230 and the center of the second chip pad 525 may be one of the various distances at which the reliable wire bonding is obtained.

Accordingly, an extending direction of the second bonding wire w2 may be perpendicular to the extending direction (Y direction) of the plurality of second upper chip pads 725 and the extending direction (Y direction) of the plurality of second bonding pads 230. The extending direction (X direction) of the second bonding wire w2 may be parallel to the extending direction (X direction) of the straight line L2 between the center of the second bonding pad 230 and the center of the second upper chip pad 725. For the brevity of drawings, FIG. 7 shows the two semiconductor chips which are stacked. The present inventive concept is not limited thereto. For example, at least three or more semiconductor chips may be stacked on each other. The uppermost semiconductor chip among at least three or more semiconductor chips may be connected to the protruding bonding layer 200 using the second bonding wire w2, and the lowermost semiconductor chip among at least three or more semiconductor chips may be connected to the first bonding pad 130 using the first bonding wire w1. Two adjacent semiconductor chips may be connected to each other using the third bonding wire w3.

Hereinafter, a method of manufacturing a package substrate (operation S100) according to an example embodiment will be described with reference to FIGS. 9 to 19. The method of manufacturing a package substrate (operation S100) may be applied to manufacture the package substrate 10 (operation S100) as described with reference to FIGS. 1 and 2.

Figure 9:
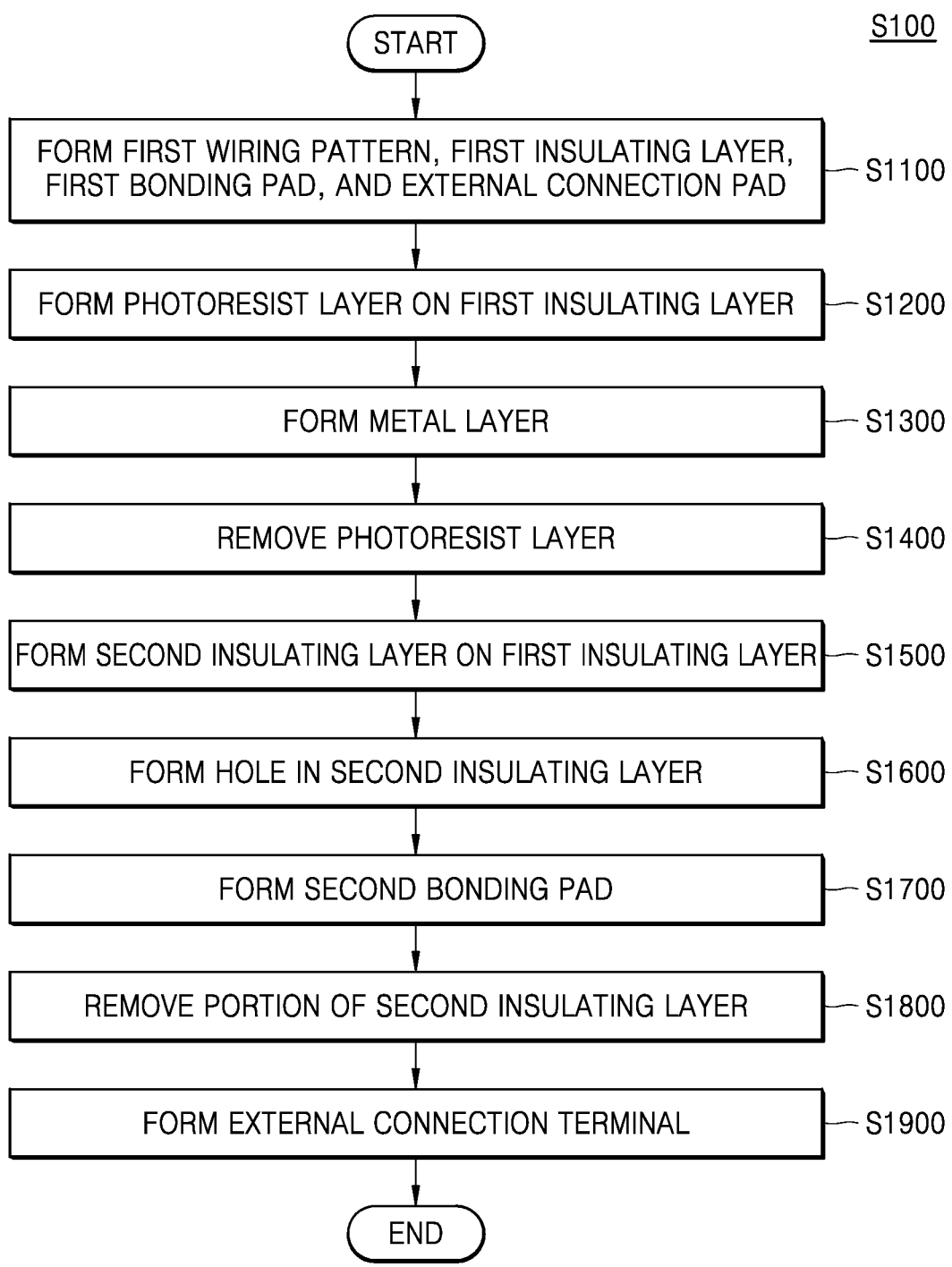
FIG. 9 is a flowchart illustrating a method of manufacturing a package substrate according to an example embodiment.

FIG. 9 is a flowchart illustrating the method of manufacturing a package substrate (operation S100) according to an example embodiment. FIGS. 10 to 19 are cross-sectional views illustrating operations of the method of manufacturing the package substrate 10 (operation S100) according to an example embodiment.

Referring to FIG. 9, the method of manufacturing the package substrate 10 (operation S100) according to an example embodiment may include operation S1100 of forming the first redistribution pattern 110, the first insulating layer 120, the first bonding pad 130, and the external connection pad 1400, operation S1200 of forming a photoresist layer PR on the first insulating layer 120, operation S1300 of forming the metal layer 210, operation S1400 of removing the photoresist layer PR, operation S1500 of forming a preliminary second insulating layer 220-P on the first insulating layer 120, operation S1600 of forming a hole H2 in the preliminary second insulating layer 220-P, operation S1700 of forming the second bonding pad 230, operation S1800 of removing a portion of the preliminary second insulating layer 220-P to form the second insulating layer 220, and operation S1900 of forming the external connection terminal 150.

Figure 10:
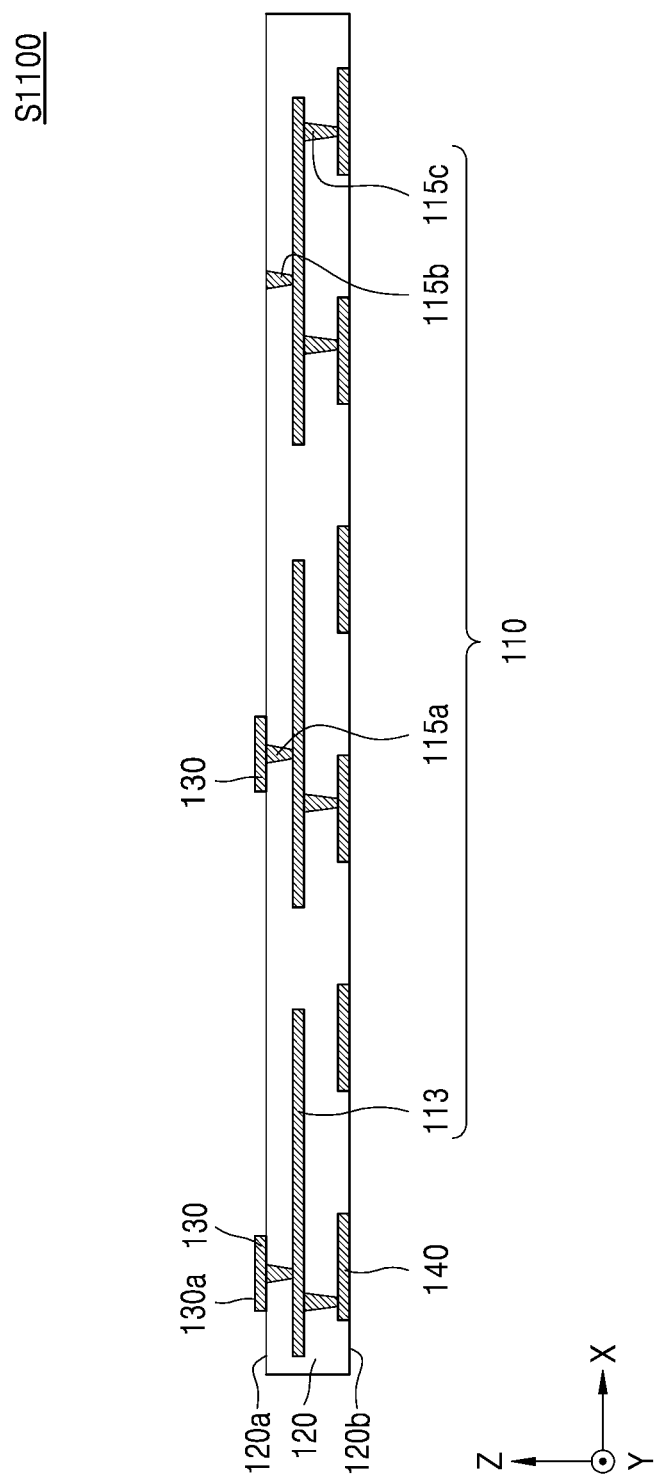
FIGS. 10 to 19 are views illustrating operations of a method of manufacturing a package substrate according to an example embodiment.

Referring to FIGS. 9 and 10 together, the method of manufacturing the package substrate 10 (operation S100) according to an example embodiment may include operation S1100 of forming the first redistribution pattern 110, the first insulating layer 120, the first bonding pad 130, and the external connection pad 140.

Operation S1100 may form the first redistribution pattern 110, the first insulating layer 120, the first bonding pad 130, and the external connection pad 140 through a photolithography process, a plating process, an etching process, or the like.

Figure 11:
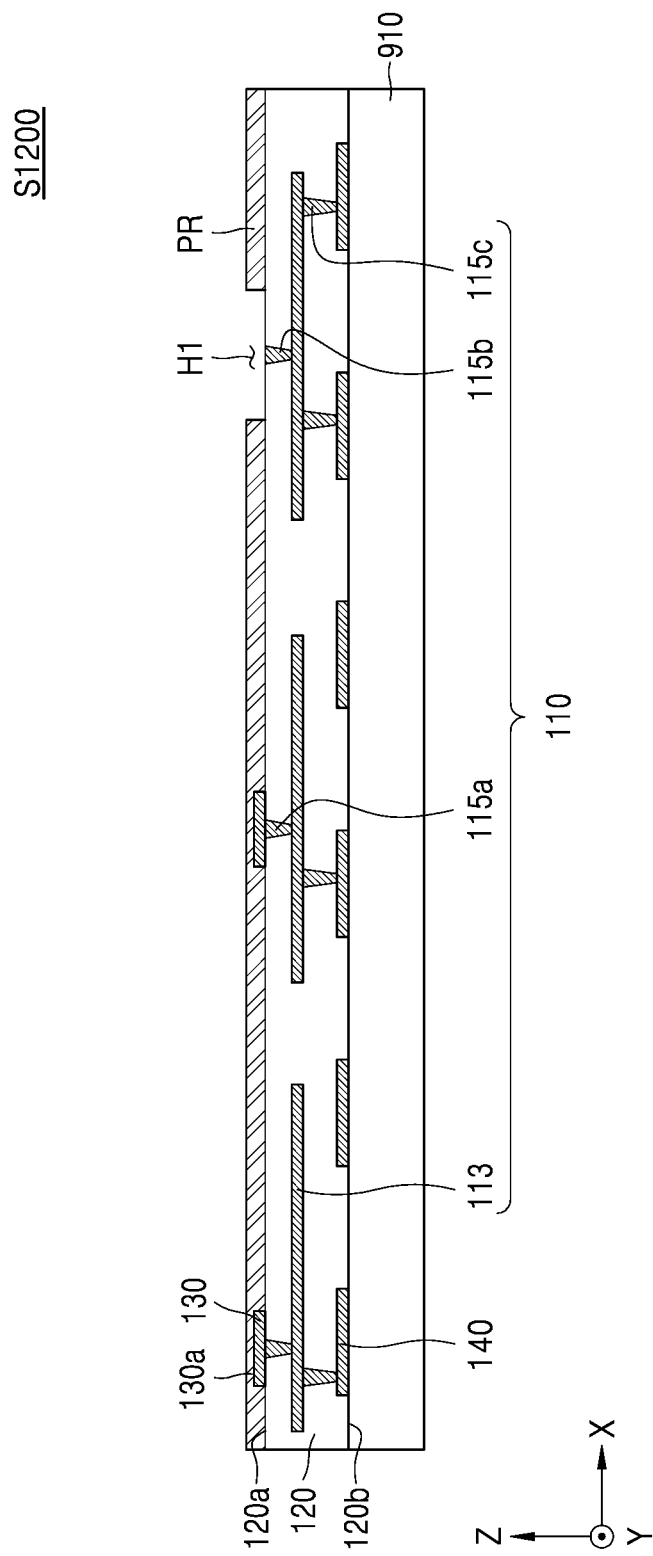

Referring to FIGS. 9 and 11 together, the method of manufacturing the package substrate 10 (operation S100) according to an example embodiment may include operation S1200 of forming the photoresist layer PR on the upper surface 120a of the first insulating layer 120.

Before performing operation S1200, a support substrate 910 may be attached under the first insulating layer 120. The support substrate 910 may be a substrate having structural stability such that the support substrate 910 keeps its shape in a photolithography process, an etching process, and a baking process.

In an example embodiment, when the support substrate 910 is to be separated and removed by laser ablation, the support substrate 910 may include or may be a translucent substrate or a transparent substrate. When the support substrate 910 is to be separated and removed by heating, the support substrate 910 may include or may be a heat-resistant substrate.

In an example embodiment, the support substrate 910 may be a glass substrate. However, the support substrate 910 is not limited thereto, and may include a heat-resistant organic polymer material such as polyimide (PI), polyetheretherketone (PEEK), polyethersulfone (PES), and polyphenylene sulfide (PPS).

In operation S1200, the photoresist layer PR may be applied to the upper surface 120a of the first insulating layer 120 through a spin coating process. For example, the photoresist layer PR may include or may be a photosensitive polymer that reacts to light.

In operation S1200, the photoresist layer PR may be patterned by a photo mask (not shown). The photoresist layer PR may have a first hole H1 exposing the second redistribution via pattern 115b of the first redistribution pattern 110 through an exposure process and a developing process. The photoresist layer PR may cover the first bonding pad 130, and the first bonding pad 130 is not exposed to the outside.

Figure 12:
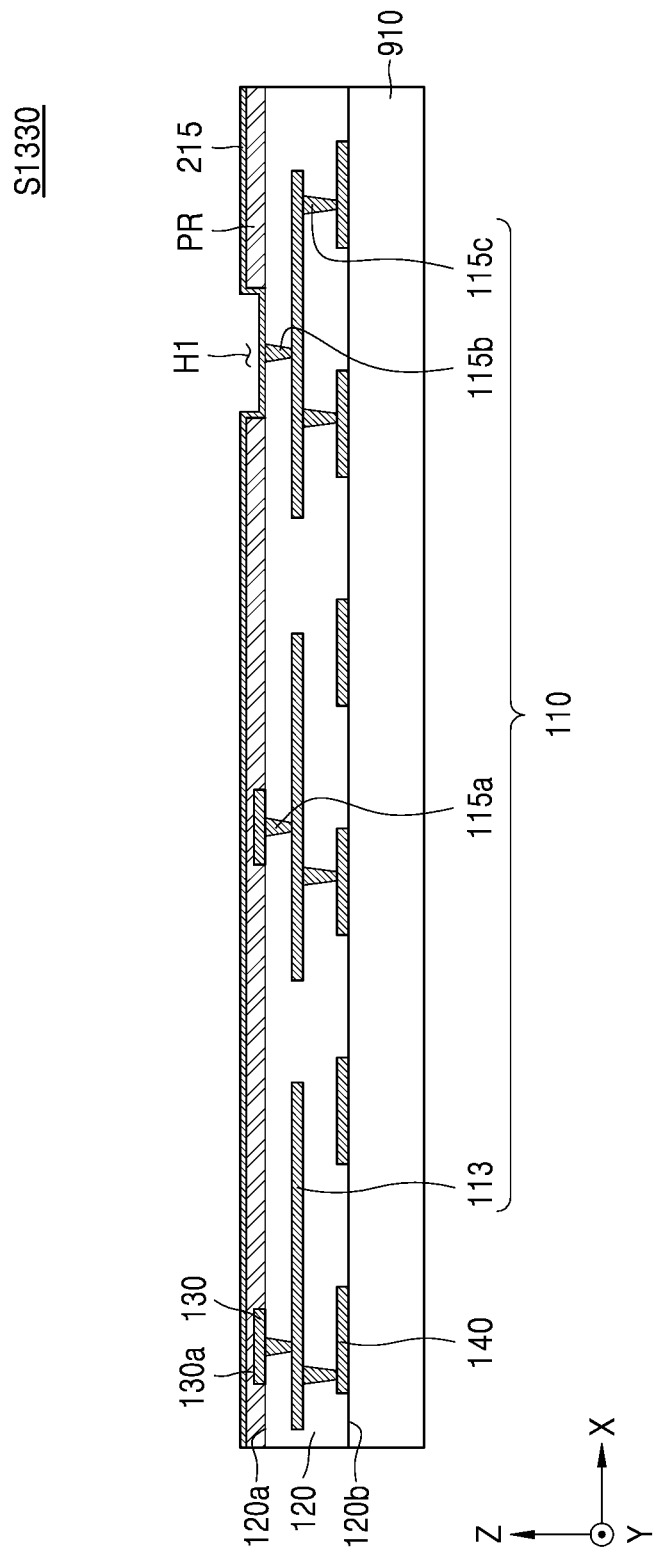
Figure 13:
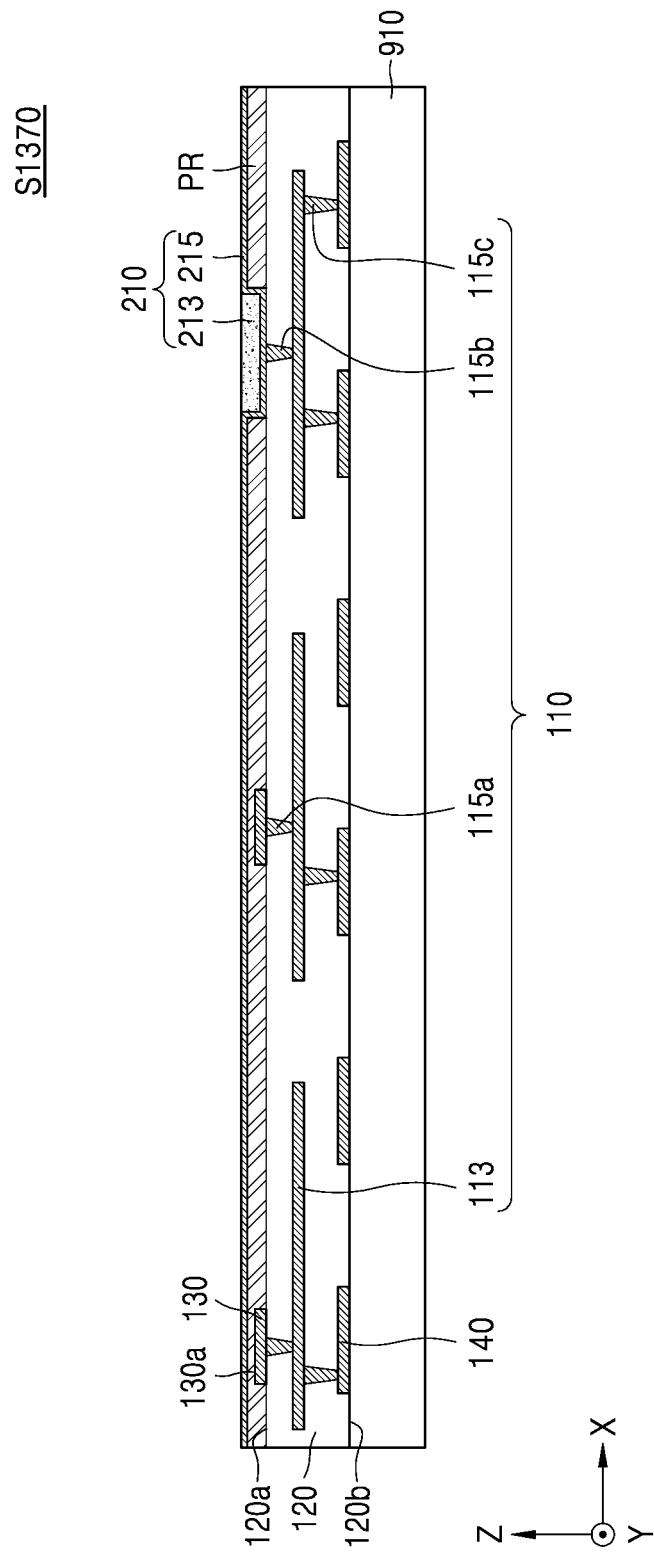

Referring to FIGS. 9, 12, and 13 together, the method of manufacturing the package substrate 10 (operation S100) according to an example embodiment may include operation S1300 of forming the metal layer 210.

Operation S1300 may include operation 51330 of forming the second seed layer 215 on the photoresist layer PR and the first insulating layer 120, and operation S1370 of forming the second redistribution pattern 213 using the second seed layer 215.

In an example embodiment, operation 51330 of forming the second seed layer 215 may include operation of forming the second seed layer 215 conformally on the photoresist layer PR and the first insulating layer 120. The second seed layer 215 may be formed through a physical vapor deposition process. The second seed layer 215 may contact the second redistribution via pattern 115b within the first hole H1 of the photoresist layer PR.

In an example embodiment, in operation S1370 of forming the second redistribution pattern 213, the first hole H1 of the photoresist layer PR may be filled with a metal material. For example, the second seed layer 215 may be a diffusion barrier layer, and the second redistribution pattern 213 may be formed through a plating process using the second seed layer 215.

Figure 14:
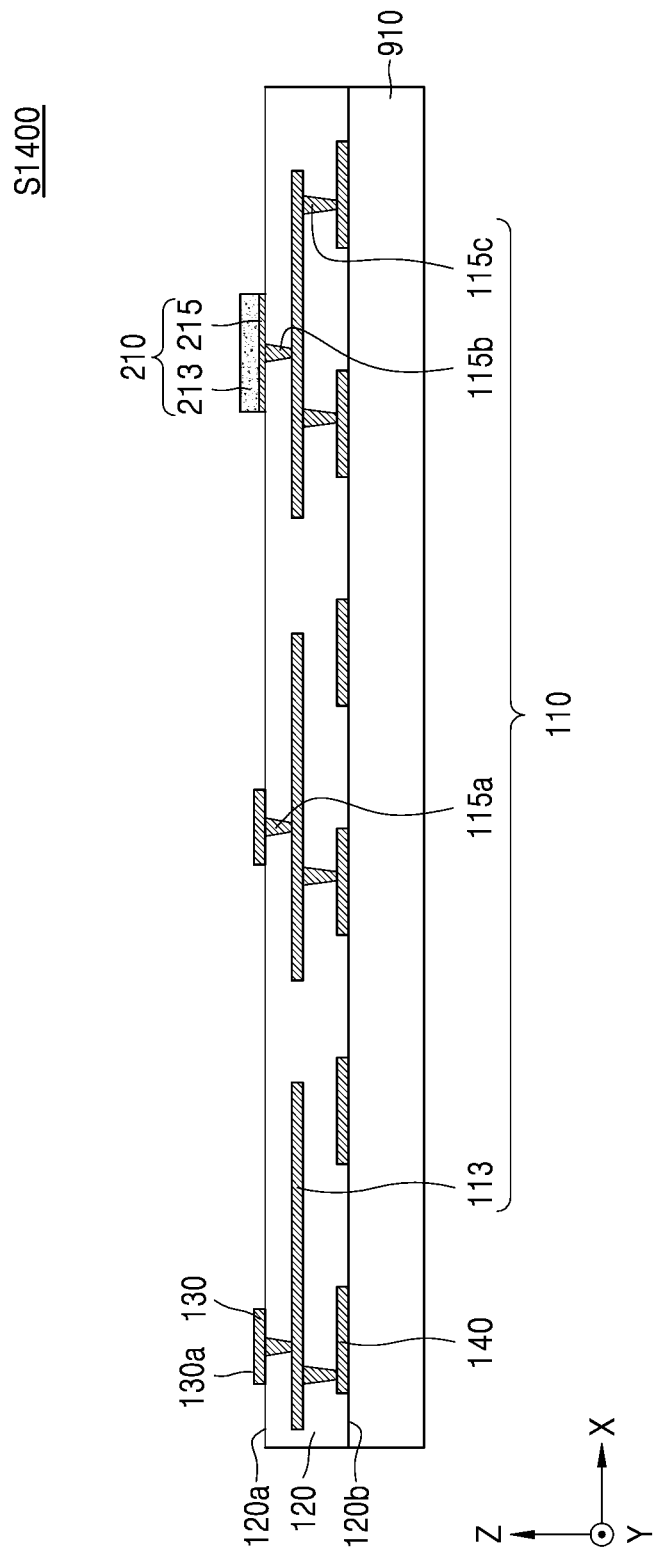

Referring to FIGS. 9 and 14 together, the method of manufacturing the package substrate 10 (operation S100) according to an example embodiment may include operation S1400 of removing the photoresist layer PR.

In operation S1400, the photoresist layer PR may be removed through an ashing process and a strip process. In an example embodiment, the second seed layer 215 and the second redistribution pattern 213 may constitute the metal layer 210 as described above, and the metal layer 210 may protrude from the upper surface 120a of the first insulating layer 120. In an exemplary embodiment, the metal layer 210 may be formed on the upper surface 120a of the first insulating layer 120.

Figure 15:
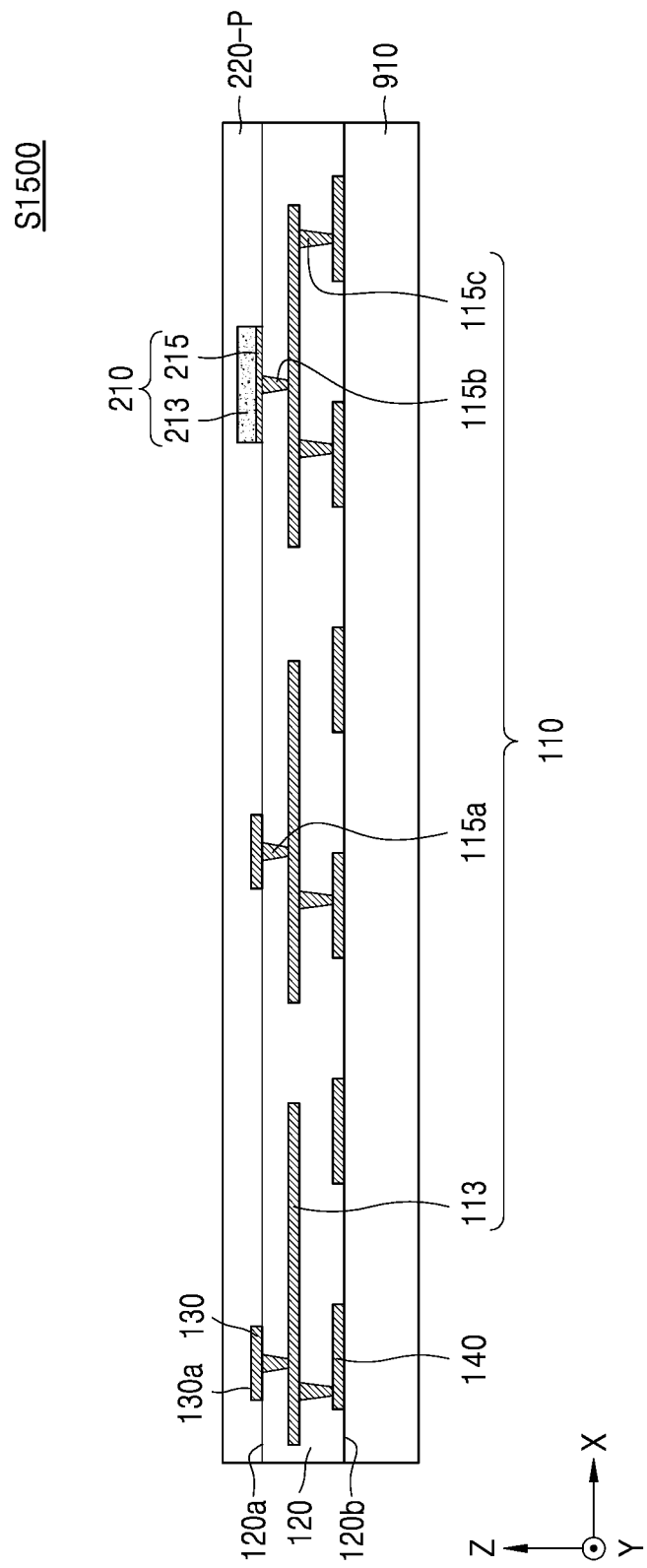

Referring to FIGS. 9 and 15 together, the method of manufacturing the package substrate 10 (operation S100) according to an example embodiment may include operation S1500 of forming the preliminary second insulating layer 220-P on the upper surface 120a of the first insulating layer 120.

In operation S1500, the preliminary second insulating layer 220-P may be formed on the first insulating layer 120 through a spin coating process. The preliminary second insulating layer 220-P may cover the metal layer 210 on the first insulating layer 120, and the metal layer 210 is not exposed to the outside by the preliminary second insulating layer 220-P.

In an example embodiment, the material of the preliminary second insulating layer 220-P may be substantially the same as the material of the first insulating layer 120. Each of the first insulating layer 120 and the preliminary second insulating layer 220-P may include or may be formed of oxide or nitride. For example, each of the first insulating layer 120 and the preliminary second insulating layer 220-P may include or may be formed of silicon oxide or silicon nitride.

Figure 16:
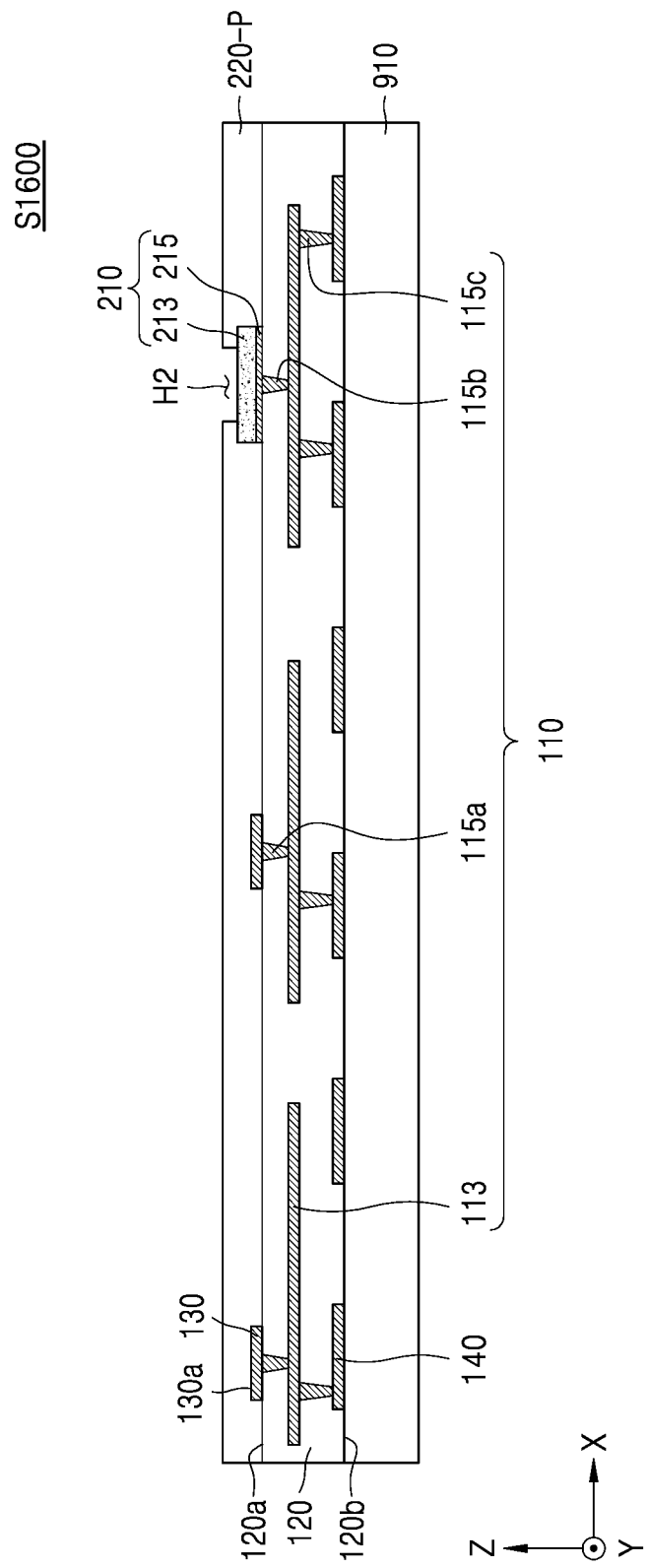

Referring to FIGS. 9 and 16 together, the method of manufacturing the package substrate 10 (operation S100) according to an example embodiment may include operation S1600 of forming the second hole H2 in the preliminary second insulating layer 220-P to expose the second redistribution pattern 213.

In operation S1600, a portion of the preliminary second insulating layer 220-P may be removed through an etching process or a drilling process such that the preliminary second insulating layer 220-P has the second hole H2 exposing at least a portion of the metal layer 210. The second hole H2 of the preliminary second insulating layer 220-P may provide a space in which the second bonding pad 230 is located.

In an example embodiment, the second hole H2 of the preliminary second insulating layer 220-P may have a tapered shape in which a cross-sectional area of the second hole H2 in a horizontal direction decreases downwards (i.e., as the second hole H2 approaches the metal layer 210). However, the inventive concept is not limited to the above, and the second hole H2 of the preliminary second insulating layer 220-P may have a uniform cross-sectional area in the horizontal direction.

Figure 17:
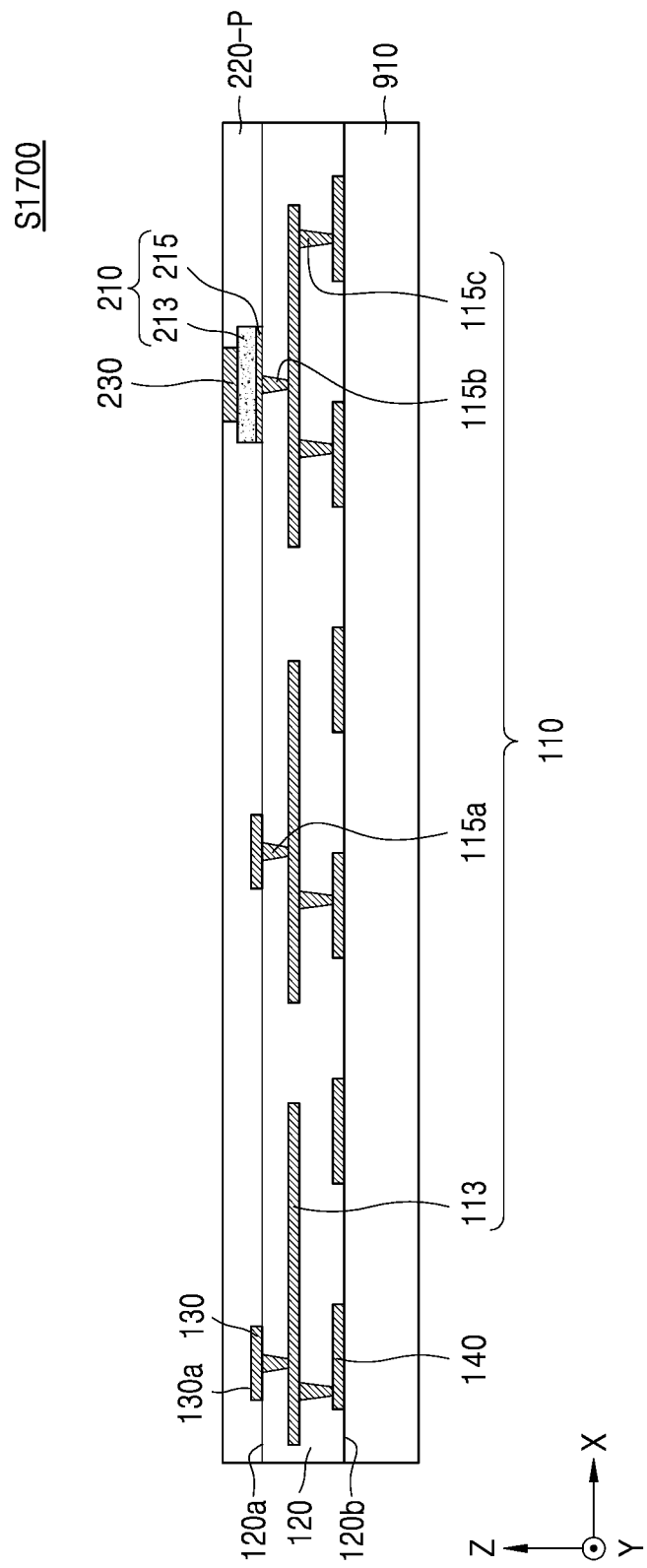

Referring to FIGS. 9 and 17 together, the method of manufacturing the package substrate 10 (operation S100) according to an example embodiment may include operation S1700 of forming the second bonding pad 230.

In operation S1700, the second bonding pad 230 may be formed by filling the second hole H2 of the preliminary second insulating layer 220-P with a conductive material. A side surface of the second bonding pad 230 may be surrounded by the preliminary second insulating layer 220-P, and the bonding surface 230a of the second bonding pad 230 may be exposed to the outside.

In an example embodiment, the metal layer 210 may protrude from the upper surface 120a of the first insulating layer 120, so that the level of the bonding surface 230a of the second bonding pad 230 may be higher than the level of the bonding surface 130a of first bonding pad 130.

Figure 18:
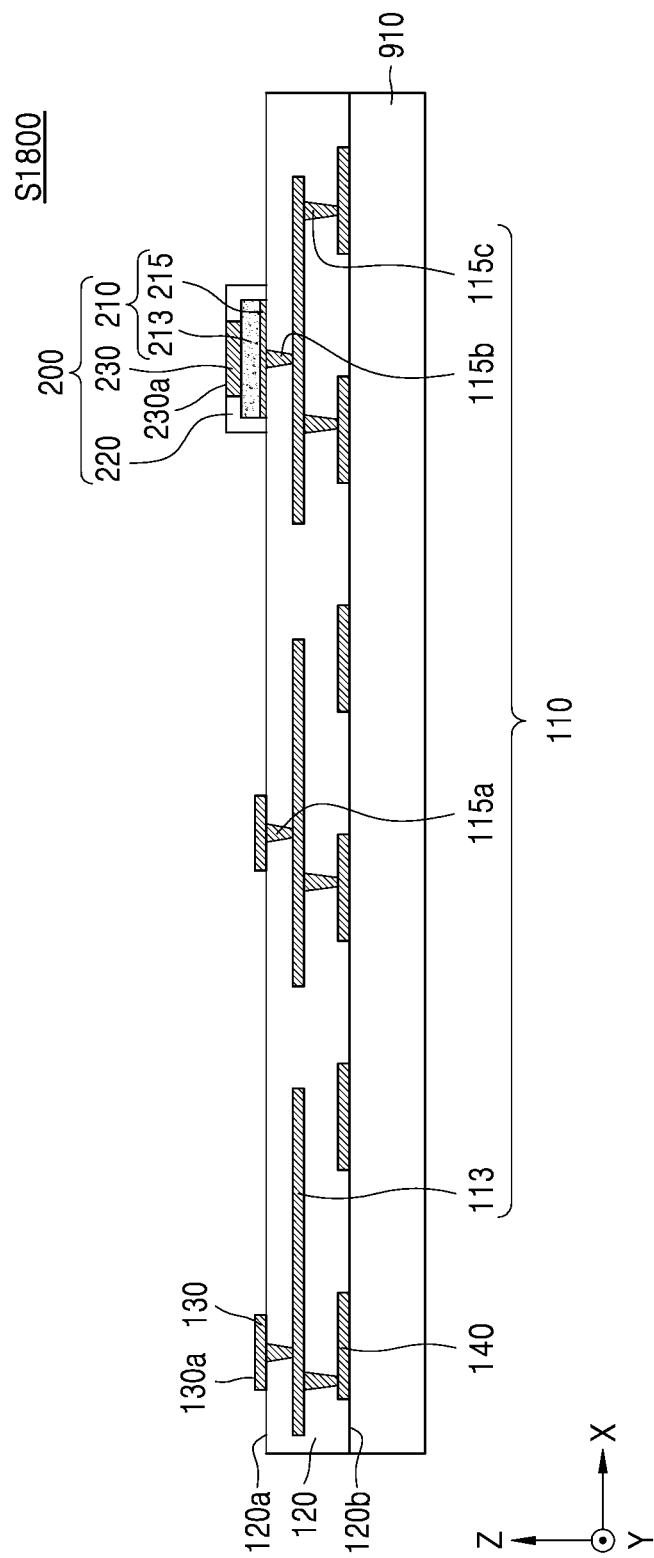

Referring to FIGS. 9 and 18 together, the method of manufacturing the package substrate 10 (operation S100) according to an example embodiment may include operation S1800 of removing a portion of the preliminary second insulating layer 220-P.

In operation S1800, a portion of the second insulating layer 220 may be removed to expose the first bonding pad 130. Further, in operation S1800, the side surface of the second bonding pad 230 may be surrounded by the second insulating layer 220 which remains after the removing of the portion of the preliminary second insulating layer 220-P.

In an example embodiment, in operation S1800, a portion of the preliminary second insulating layer 220-P may be removed such that the second insulating layer 220 contacts the first insulating layer 120 and surrounds the side surfaces of the metal layer 210 and the second bonding pad 230. Because the side and upper surfaces of the metal layer 210 may be covered by the second insulating layer 220, the metal layer 210 is not exposed to the outside.

However, the inventive concept is not limited to the above, and in operation S1800, a portion of the preliminary second insulating layer 220-P may be removed such that the second insulating layer 220 contacts the metal layer 210 and surrounds the side surface of the second bonding pad 230. A portion of the preliminary second insulating layer 220-P may be removed such that a side surface of the second insulating layer 220 is on the same plane as the side surface of the metal layer 210. For example, the side surface of the second insulating layer 220 and the side surface of the metal layer 210 may be coplanar with each other in a vertical direction. Accordingly, the side surface of the metal layer 210 may be exposed to the outside.

The metal layer 210, the second insulating layer 220, and the second bonding pad 230 generated through the above-described manufacturing operations may constitute the protruding bonding layer 200. The protruding bonding layer 200 may be a layer protruding upward from a portion of the upper surface 120a of the first insulating layer 120.

In an example embodiment, the protruding bonding layer 200 may be formed as a single layer or as two or more layers on the upper surface 120a of the first insulating layer 120.

In an example embodiment, when a structure generated by performing operation S1800 is viewed from a plan view, the protruding bonding layer 200 may extend in a linear direction on the upper surface 120a of the first insulating layer 120. For example, the extending direction of the protruding bonding layer 200 may be a direction parallel to the extending direction of the side surface of the semiconductor chip 50 (of FIG. 5) mounted on the package substrate 10. In an exemplary embodiment, when the package substrate 10 is viewed from a plan view, the protruding bonding layer 200 may be of a rectangular shape with the longest side which extends in a first direction on the upper surface 120a of the first insulating layer 120, and the area of the protruding bonding layer 200 may be less than the area of the first insulating layer 120. In an exemplary embodiment, the first direction in which the longest side of the protruding bonding layer 200 extends is in parallel to the extending direction of a side surface of the semiconductor chip 50.

In an example embodiment, because the protruding bonding layer 200 may include the metal layer 210 and the second bonding pad 230 protruding from the first insulating layer 120 and electrically connected to the first redistribution pattern 110, the restriction on a location where the protruding bonding layer 200 is generated may be relaxed. For example, the protruding bonding layer 200 may be formed on the first insulating layer 120 such that any portion of a bottom surface of the protruding bonding layer 200 (e.g., an edge portion of the bottom surface of the protruding bonding layer 200 or the center portion of the bottom surface of the protruding bonding layer 200) may be connected to the second redistribution via pattern 115b of the first redistribution pattern 110.

Because the level of the bonding surface 230a of the second bonding pad 230 may be higher than the level of the bonding surface 130a of the first bonding pad 130, a length of the second bonding wire w2 connecting the semiconductor chip 50 (of FIG. 5) to the second bonding pad 230 may be shortened. Accordingly, the reliability of bonding of the second bonding wire w2 and the second bonding pad 230 may be improved, and the manufacturing costs of the semiconductor package 1 (of FIG. 5) using the package substrate 10 may be reduced.

Figure 19:
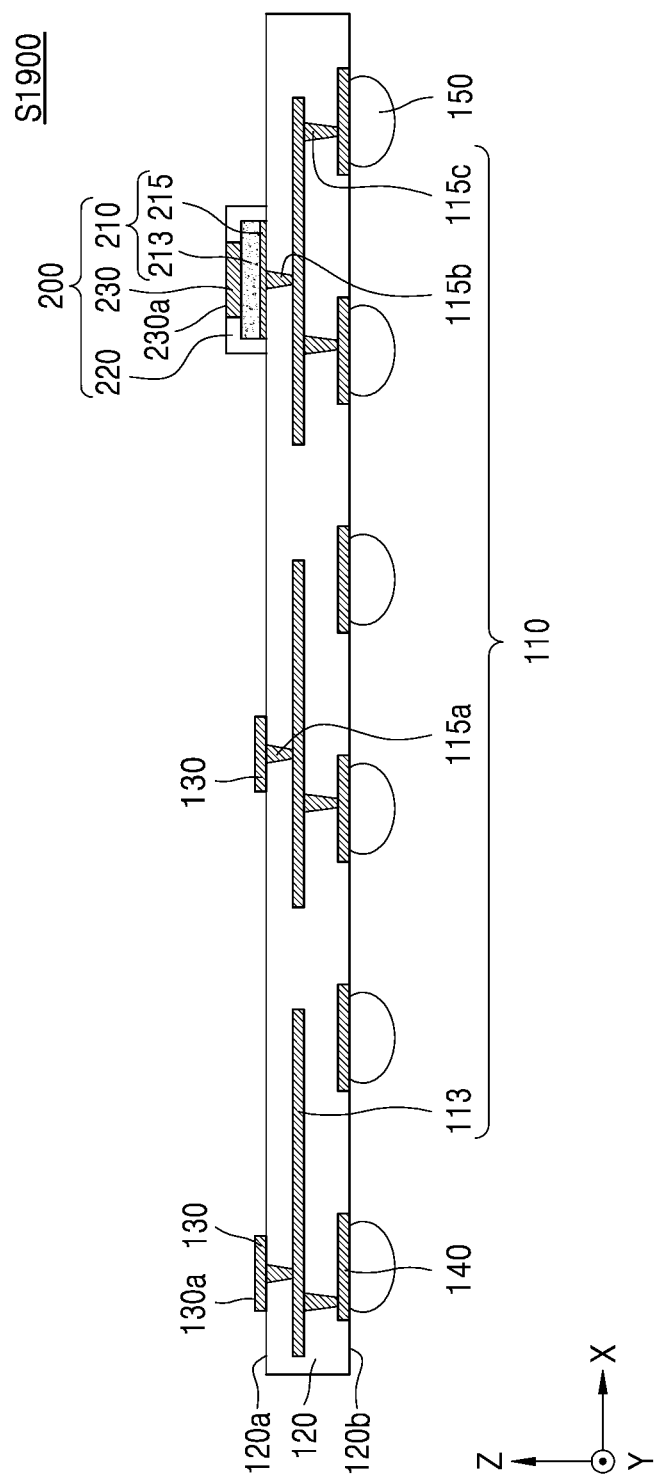

Referring to FIGS. 9 and 19 together, the method of manufacturing the package substrate 10 (operation S100) according to an example embodiment may include operation S1900 of forming the external connection terminal 150.

Before performing operation S1900, the support substrate 910 attached to the lower surface 120b of the first insulating layer 120 may be removed. In an example embodiment, the support substrate 910 may be separated by laser ablation or may be separated by heating.

In operation S1900, the external connection terminal 150 may be attached to the external connection pad 140. In an example embodiment, in operation S1900, a solder ball of a metal material may be attached to the external connection pad 140. For example, the external connection terminal 150 may be melted through a reflow process and attached to the external connection pad 140.

While the inventive concept has been particularly shown and described with reference to embodiments thereof, it will be understood that various changes in form and details may be made therein without departing from the spirit and scope of the following claims.

What is claimed is:
1. A package substrate comprising:
a first insulating layer having an upper surface and a lower surface which are opposite to each other;
a first redistribution wiring buried in the first insulating layer;
a first bonding pad including a lower surface which is connected to a corresponding portion of the first redistribution wiring and is disposed on the upper surface of the first insulating layer, and a first bonding surface opposite to the lower surface of the first bonding pad; and
a second, elevated, bonding pad disposed on the upper surface of the first insulating layer, the second, elevated, bonding pad including:
a metal layer disposed on the upper surface of the first insulating layer and connected to a corresponding portion of the first redistribution wiring, and
a second bonding pad layer having a lower surface which is connected to the metal layer and a second bonding surface which is opposite to the lower surface of the second bonding pad layer,
wherein the metal layer and the second bonding pad layer are stacked on each other such that the metal layer is disposed between the upper surface of the first insulating layer and the lower surface of the second bonding pad layer, and
wherein the second bonding surface of the second bonding pad layer is higher than the first bonding surface of the first bonding pad.
2. The package substrate of claim 1,
wherein when the package substrate is viewed from a plan view, an area of the metal layer is greater than an area of the second bonding pad layer.
3. The package substrate of claim 1, further comprising:
a second insulating layer surrounding a side surface of the second bonding pad layer.
4. The package substrate of claim 3,
wherein the second insulating layer contacts the upper surface of the first insulating layer and further surrounds a side surface of the metal layer.
5. The package substrate of claim 3,
wherein the second insulating layer contacts an upper surface of the metal layer, and
wherein a side surface of the second insulating layer and a side surface of the metal layer are coplanar in a vertical direction.

6. The package substrate of claim 1,
wherein the first redistribution wiring comprises:
a redistribution line pattern extending in a horizontal direction in the first insulating layer;
a first redistribution via pattern extending in a vertical direction in the first insulating layer and connecting the redistribution line pattern to the first bonding pad; and
a second redistribution via pattern extending in a vertical direction in the first insulating layer and connecting the redistribution line pattern to the metal layer.

7. The package substrate of claim 6,
wherein the metal layer comprises:
a first metal layer electrically connected to the redistribution line pattern through the second redistribution via pattern; and
a seed layer between the first metal layer and the first insulating layer.

8. The package substrate of claim 3,
wherein the second, elevated, bonding pad is one of a plurality of elevated bonding pads which are spaced apart from each other,
wherein, when the package substrate is viewed from a plan view, the plurality of elevated bonding pads are arranged in a first direction, and a lengthwise direction of the second insulating layer is parallel to the first direction, and
wherein the second insulating layer surrounds a side surface of a second bonding pad layer of each of the plurality of elevated bonding pads.

9. The package substrate of claim 3,
wherein a material of the first insulating layer is the same as a material of the second insulating layer.

10. The package substrate of claim 1,
wherein a height of the second bonding surface of the second bonding pad layer has a value from 0.02 mm to 0.04 mm above the upper surface of the first insulating layer.

11. A semiconductor package comprising:
a package substrate including:
a first insulating layer having an upper surface and a lower surface which are opposite to each other,
a first redistribution wiring buried in the first insulating layer,
a first bonding pad disposed on the upper surface of the first insulating layer, having a first bonding surface, and connected to a portion of the first redistribution wiring,
a second, elevated, bonding pad including a metal layer which is disposed on the upper surface of the first insulating layer and connected to a portion of the first redistribution wiring, and a second bonding pad layer which is disposed on the metal layer and has a second bonding surface higher than the first bonding surface of the first bonding pad, and
a second insulating layer protruding from the upper surface of the first insulating layer, and surrounding a side surface of the metal layer and a side surface of the second bonding pad layer;
a first semiconductor chip mounted on the upper surface of the first insulating layer of the package substrate and including a lower chip pad;
a second semiconductor chip mounted on the first semiconductor chip and including a first upper chip pad and a second upper chip pad;
a first bonding wire connecting the lower chip pad of the first semiconductor chip to the first bonding pad of the package substrate;
a second bonding wire connecting the second upper chip pad of the second semiconductor chip to the second bonding pad layer of the second bonding pad; and
a third bonding wire connecting the lower chip pad of the first semiconductor chip to the first upper chip pad of the second semiconductor chip.

12. The semiconductor package of claim 11,
wherein the second, elevated, bonding pad is one of a plurality of elevated bonding pads which are disposed on the upper surface of the first insulating layer, and the second upper chip pad is one of a plurality of upper chip pads of the second semiconductor chip, and
wherein when the semiconductor package is viewed from a plan view, the plurality of elevated bonding pads of the package substrate are arranged in a first direction, and the plurality of upper chip pads of the second semiconductor chip are arranged in the first direction.

13. The semiconductor package of claim 12,
wherein, when the semiconductor package is viewed from the plan view, a straight line connecting the center of the second upper chip pad to the center of the second bonding pad layer is perpendicular to the first direction.

14. The semiconductor package of claim 12,
wherein, when the semiconductor package is viewed from the plan view, the extending direction of the second bonding wire is perpendicular to the first direction.

15. The semiconductor package of claim 11,
wherein the second bonding pad layer has a tapered shape in which a cross-sectional area of the second bonding pad layer in a horizontal direction decreases towards the metal layer.

16. The semiconductor package of claim 11,
wherein the first redistribution wiring comprises:
a redistribution line pattern extending in a horizontal direction in the first insulating layer;
a first redistribution via pattern extending in a vertical direction in the first insulating layer and connecting the redistribution line pattern to the first bonding pad; and
a second redistribution via pattern extending in a vertical direction in the first insulating layer and connecting the redistribution line pattern to the metal layer.

17. A semiconductor package comprising:
a package substrate including:
a first insulating layer having an upper surface and a lower surface which are opposite to each other,
a first redistribution wiring buried in the first insulating layer,
a first bonding pad disposed on the upper surface of the first insulating layer, having a first bonding surface, and connected to a corresponding portion of the first redistribution wiring,
a second, elevated, bonding pad disposed on the upper surface of the first insulating layer, and including a metal layer which is disposed on the upper surface of the first insulating layer and is connected to a corresponding portion of the first redistribution wiring, and a second bonding pad layer which is disposed on the metal layer and has a second bonding surface higher than the first bonding surface of the first bonding pad, and
a second insulating layer surrounding a side surface of the second bonding pad layer;
a semiconductor chip mounted on the upper surface of the first insulating layer and having a first chip pad and a second chip pad;

a first bonding wire connecting the first chip pad of the semiconductor chip to the first bonding pad of the package substrate; and a second bonding wire connecting the second chip pad of the semiconductor chip to the second bonding pad layer of the second bonding pad of the package substrate.

18. The semiconductor package of claim 17, wherein the second insulating layer protrudes from the upper surface of the first insulating layer and further surrounds a side surface of the metal layer of the second bonding pad.

19. The semiconductor package of claim 17, wherein the second insulating layer contacts an upper surface of the metal layer, and wherein a side surface of the second insulating layer and a side surface of the metal layer are coplanar in a vertical direction.

20. The semiconductor package of claim 17, wherein the second, elevated, bonding pad is one of a plurality of elevated bonding pads, wherein the second chip pad of the semiconductor chip is one of a plurality of chip pads of the semiconductor chip, wherein when the semiconductor package is viewed from a plan view, the plurality of elevated bonding pads are arranged in a first direction, and the plurality of chip pads are arranged in the first direction, and wherein a straight line connecting the center of the second chip pad to the center of the second bonding pad layer is perpendicular to the first direction.

* * * * *